United States Patent
Haseyama et al.

(10) Patent No.: US 6,229,320 B1
(45) Date of Patent: *May 8, 2001

(54) IC SOCKET, A TEST METHOD USING THE SAME AND AN IC SOCKET MOUNTING MECHANISM

(75) Inventors: Makoto Haseyama; Shigeyuki Maruyama; Masataka Mizukoshi; Futoshi Fukaya, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/820,357

(22) Filed: Mar. 12, 1997

Related U.S. Application Data

(63) Continuation-in-part of application No. 08/531,449, filed on Sep. 21, 1996, now Pat. No. 5,854,558.

(30) Foreign Application Priority Data

Feb. 8, 1996 (JP) .................................................. 8-227185

(51) Int. Cl.⁷ .................................................. G01R 31/02
(52) U.S. Cl. .............................. 324/754; 324/755; 439/71
(58) Field of Search .................................... 324/754, 755, 324/757, 758, 761, 765; 439/70, 71, 387, 69

(56) References Cited

U.S. PATENT DOCUMENTS

| 5,055,777 | * | 10/1991 | Bonelli et al. | 324/754 |
|---|---|---|---|---|
| 5,127,837 | * | 7/1992 | Shah et al. | 439/71 |
| 5,500,605 | * | 3/1996 | Chang | 324/758 |
| 5,702,255 | * | 12/1997 | Murphy et al. | 439/71 |
| 5,791,914 | * | 8/1998 | Loranger et al. | 439/71 |
| 5,831,441 | * | 11/1998 | Motooka et al. | 324/754 |

FOREIGN PATENT DOCUMENTS 5-283490   10/1993 (JP) .

OTHER PUBLICATIONS

Moto'o Nakano, "A Probe for Testing Semiconductor Integrated Circuits and a Test Method Using Said Probe," Mar. 25, 1991, Japanese Patent Office Disclosure No. Hei 3–69131, Filing No. Hei 1–205301, Filing date Aug. 8, 1989.*

* cited by examiner

*Primary Examiner*—Safet Metjahic
*Assistant Examiner*—Russell M. Kobert
(74) *Attorney, Agent, or Firm*—Armstrong, Westerman, Hattori, McLeland & Naughton, LLP

(57) ABSTRACT

An IC to be tested having solder bumps is mounted on an IC socket mounted on a test board. The IC socket is provided with a contact unit including a plurality of straight contact pins each having an lower end connected to the test board and an upper end connected to the solder bumps and also including an elastic member for supporting the plurality of contact pins. A diameter of the plurality of contact pins is configured to be sufficiently small for the plurality of contact pins to pierce the respective solder bumps so that an electrical connection is established by the upper end of each of the plurality of solder bumps piercing an associated one of the solder bumps.

22 Claims, 16 Drawing Sheets

FIG. 19
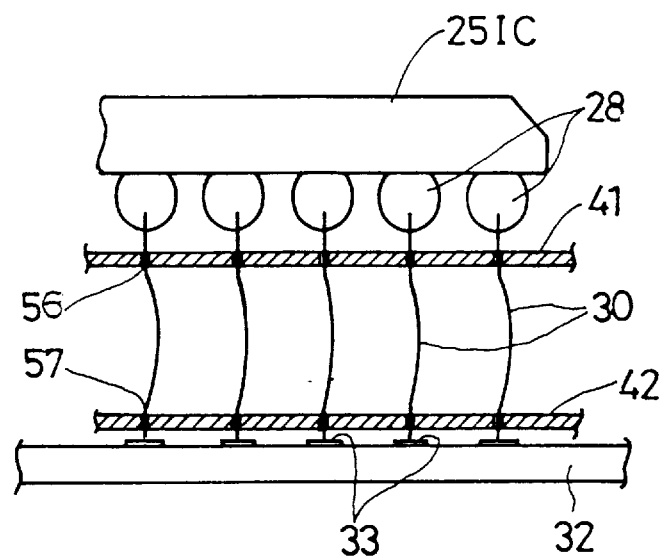
FIG. 20A
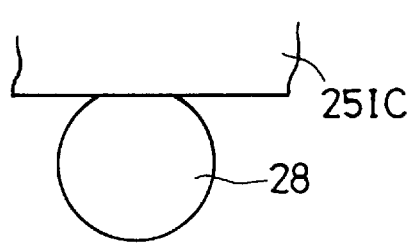
FIG. 20B
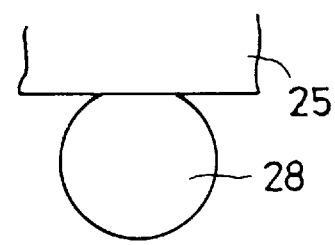
FIG. 20C
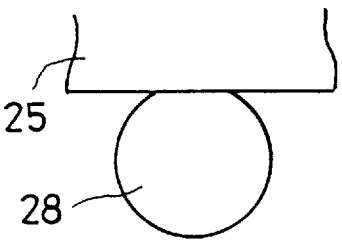
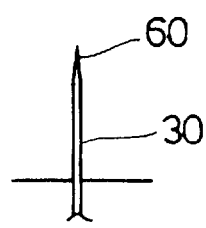
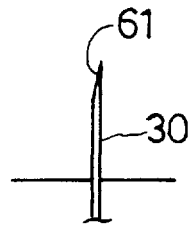
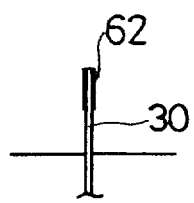

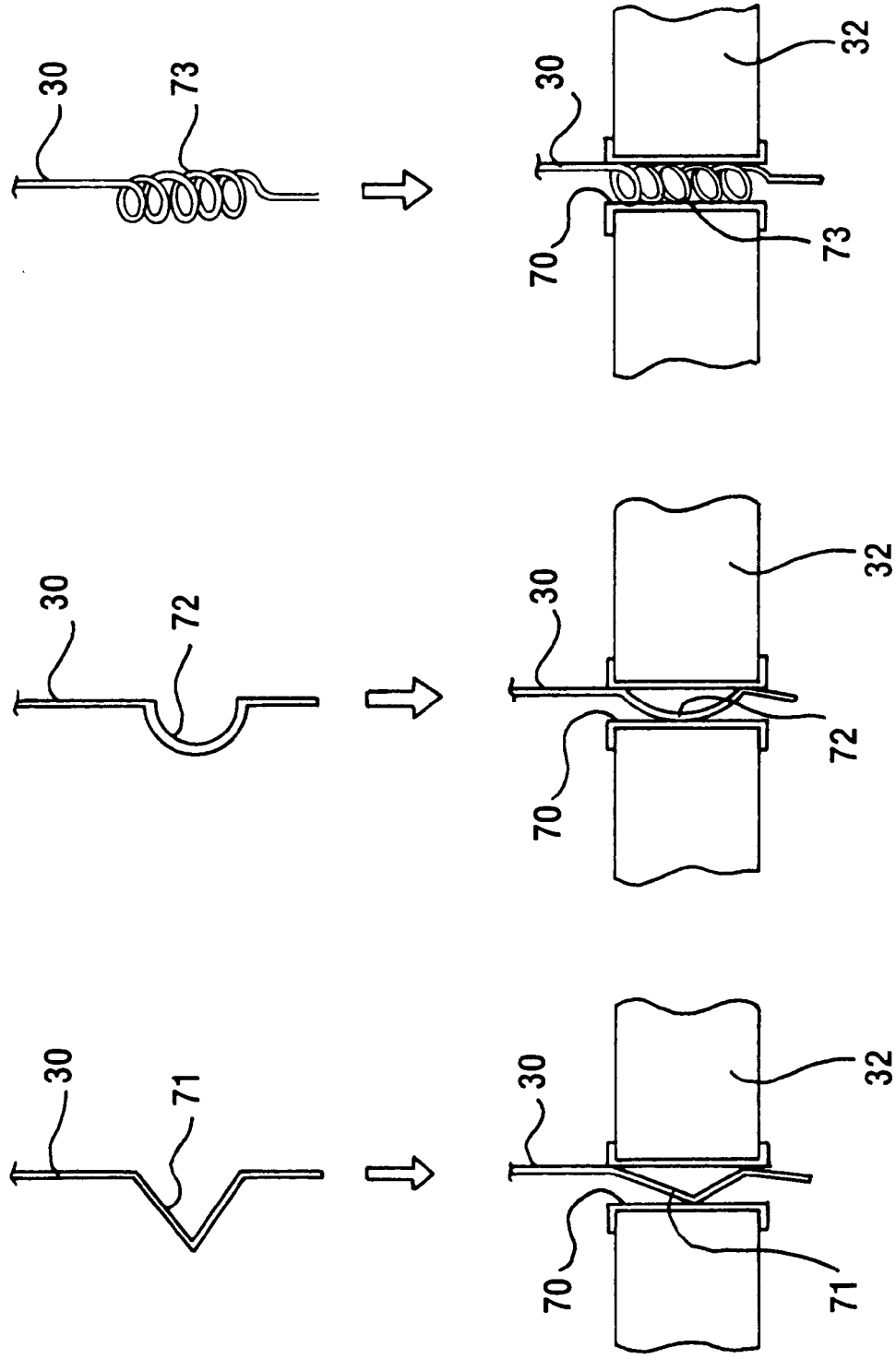

IC SOCKET, A TEST METHOD USING THE SAME AND AN IC SOCKET MOUNTING MECHANISM

This application is a continuation-in-part of application Ser. No. 08/531,449, filed Sep. 21, 1996, now U.S. Pat. No. 5,854,558.

BACKGROUND OF THE INVENTION

1. Field of the Invention

The present invention relates to IC sockets, test methods using the same and IC socket mounting mechanisms, and more particularly, to an IC socket for testing a semiconductor device (IC) having projection electrodes formed as bumps or the like, a test method using such an IC socket and a mechanism for mounting such an IC socket.

Many of the ICs used recently are constructed to have projection electrodes formed as solder bumps for connection with an external device, for the purpose of reducing the size of a package. For example, a ball grid array (BGA) has such a construction. Demands for high-density, high-speed semiconductor devices having projection electrodes are growing for further reduction in the package size. Associated with this, pitch between electrodes is on a decreasing trend; and projection electrodes are being arranged with an increasingly higher density and on an increasingly reduced scale.

Once produced, the ICs are subject to a performance test to see if a prescribed performance is provided. The ICs are tested by being mounted on an IC socket. Therefore, the IC socket should be adapted for the high-density, small-scale trend of the ICs. As a result of the high-density, small-scale trend, the strength of each projection electrode has become extremely low so that it is necessary to ensure that the projection electrodes are not damaged when brought into contact with contact pins provided in the IC socket.

2. Description of the Related Art

FIGS. 1–5 show a construction of a conventional IC socket 1. As shown in FIGS. 1–3, the IC socket 1 generally comprises a socket body 2, a lid 3, contact pins 4 and a substrate 5. The IC socket 1 is designed so that an IC 7 of a BGA type provided with solder bumps 6 (projection electrodes) is mounted on the IC socket 1 and tested for its performance.

The socket body 2 includes a cavity 8 in which the substrate 5 is fitted. The cavity 8 is provided with through holes 9 aligned with the solder bumps 6 formed in the IC 7. The substrate 5 is provided with mounting holes 10 also aligned with the solder bumps 6 formed in the IC 7.

The contact pins 4 are formed by punching a thin metal plate so as to have a crooked configuration that provides a spring action as shown in FIGS. 2 and 3. The contact pins 4 have contact parts 4a, formed at the upper end thereof, inserted into mounting holes 10 of the substrate 5. Terminal parts 4b formed at the lower end the contact pins 4 are inserted into the through holes 9 formed in the cavity 8 and are made to project from the bottom of the socket body 2. The same number of the crooked contact pins 4 is provided as the number of solder bumps 6 formed in the IC 7. The contact pins 4 are designed to remain press-fitted into the through holes 9 and the mounting holes 10 while being accommodated in the IC socket 1.

The lid 3 is rotatably fitted to the socket body 2 by a pivot part 11. By closing the lid 3 when the IC 7 has been mounted on the socket body 2, the lid 3 presses the IC 7 toward the substrate 5. As a result, the bumps 6 formed in the IC 7 are pressed against the contact parts 4a of the contact pins 4. The contact pins 4 are elastically deformed so as to press the solder bumps 6 by the elastic action. Accordingly, the contact pins 4 and the solder bumps 6 are electrically connected. A lock lever 12 is provided in a lid 3. The lock lever 12 locks the lid 3 in the closed position.

The IC socket 1 having the above-described construction is designed to be mounted on a test board 13 by a solder reflow process or the like after the terminal parts 4b projecting from the underside of the socket body 2 are inserted into through holes 14 formed in the test board 13. The test board 13 is connected to a test device (for example, a burn-in test device) for performing a test of the IC 7. Thus, a prescribed test is performed on the IC 7 mounted on the IC socket 1 via the test board 13.

It is known that a thin oxide film 15 (see FIG. 5) is formed on the surface of the solder bumps 6 formed in the IC 7. Since the oxide film 15 has a low conductivity, it is necessary to penetrate the oxide film 15 in order to establish an electrical connection between the solder bumps 6 and the contact pins 4.

Conventionally, as shown in FIG. 4 showing the part A indicated by the arrow in FIG. 3 on an enlarged scale, the elastic deformation of the contact pins 4 occurring when the lid 3 is closed is utilized. More specifically, it is expected that the elastic deformation causes the contact parts 4a of the contact pins 4 to be displaced in the direction indicated by the arrow of FIG. 4 so that the contact parts 4a slide on the surface of the solder bumps 6 such that the contact parts 4a penetrate the oxide film 15.

With the increasingly smaller solder bumps 6 provided on the IC 7 recently, the strength of the solder bumps 6 has decreased. Accordingly, the method whereby the contact parts 4a are expected to penetrate the oxide film 15 by sliding on the surface of the solder bumps 6 produces a deformation in the solder bump 6 while the contact parts 4a slide on the surface thereof. The deformation of the solder bumps is indicated by the arrow 6a of FIG. 5. If any of the solder bumps 6 is deformed, a variation in the height of the solder bumps 6 occurs when the IC 7 is mounted on a circuit board or the like after the test. The solder bumps 6 may not be properly mounted on the circuit board.

In the conventional IC socket 1, a high level of precision is required to provide the contact pins 4 having a crooked configuration that provides a spring action in the socket body 2. The press-fitting of the crooked contact pins 4 demands intensive attention. Another problems is that, as the size of the contact pins 4 become smaller with the reduction in the size of the solder bumps 6, it is increasingly difficult to produce the contact pins 4 having a complex crooked configuration, and the cost of the production increases accordingly.

SUMMARY OF THE INVENTION

Accordingly, it is an object of the present invention to provide an IC socket, a test method using the same and an IC socket mounting mechanism.

Another and more specific object of the present invention is to provide an IC socket, capable of performing high-precision testing without damaging small projection electrodes, a test method using such an IC socket and an IC socket mounting mechanism for mounting such an IC socket.

In order to attain the aforementioned objects, the present invention provides an IC socket mounted on a test board while in use and having a semiconductor device with projection electrodes mounted on said IC socket for testing, said IC socket is constructed such that a diameter of a plurality of straight contact pins having a first end electrically connected to said test board and a second end thereof connected to said projection electrodes is sufficiently small for each of said plurality of contact pins to pierce said projection electrodes, said IC socket being electrically connected to said test board by said first end of said plurality of contact pins piercing said projection electrodes.

According to the IC socket of the present invention described above, one end of each of the contact pins constituting the contact unit is electrically connected to a test board and the other end is connected to the projection electrodes. Thus, an electrical connection is properly established between the projection electrodes and the test board.

By configuring the diameter of the contact pin to be small enough for the contact pin to pierce the projection electrode for an electrical connection therewith, it is ensured that, even if an insulating film such as an oxide film is created on the projection electrode, the contact pin can be electrically connected to the projection electrode by penetrating the insulating film.

Since the contact pin has a significantly small diameter, the projection electrode is not deformed, only a fine hole being created in the projection electrode when pierced by the contact pin. Thus, a high-precision mounting of an IC is possible.

Even with its fine diameter, it is highly unlikely that the contact pin is bent or curved because the contact pins are supported by the supporting structure constituting the contact unit. Therefore, an electrical connection is properly established between the contact pin and the projection electrode.

The aforementioned objects may also be attained by an IC socket mounted on a test board while in use and having a semiconductor device with projection electrodes mounted on said IC socket for testing, said IC socket comprising: a plurality of straight contact pins having a first end electrically connected to said test board and a second end connected to said projection electrodes; and a supporting structure for supporting said plurality of contact pins, each of said plurality of contact pins provided at the second end with a deformable part deformable according to a pressure occurring between said contact pin and an associated one of said projection electrodes.

According to the IC socket according to the present invention described above, deformation of the deformable part provided at that portion of the contact pin which is connected with the projection electrode cancels a variation in the height of the projection electrodes or a variation in the pressure caused by an irregularity on the surface of the test board. Since the deformable part is deformed in conformity to the configuration of the projection electrodes, a relatively large contact area is secured. Thus, the deformable part is suitable for improving an electrical conductivity between the contact pins and the projection electrodes.

Even when the projection electrodes are formed of a soft metal such as a solder, the pressure applied to the projection electrodes is relatively small as a result of the deformable part being deformed. Accordingly, an electrical connection can be properly established between the contact pins and the projection electrodes without causing damage in the projection electrodes.

The aforementioned objects may also be attained by an IC socket mounting mechanism for mounting, on a test board, an IC socket comprising a contact unit having a plurality of straight contact pins for electrically connecting the test board and projection electrodes of a semiconductor device and also having a supporting structure for supporting said plurality of contact pins, the test board included in said IC socket mounting mechanism being provided with through holes to which said plurality of contact pins are electrically connected, and each of said plurality of contact pins having one end thereof connected to said test board and provided with an elastically deformable part so that an elastic resilient force generated when said elastically deformable part is inserted in an associated one of said through holes causes said contact pin to be pressed against the through hole and to establish an electrical connection therewith.

According to the IC socket mounting mechanism of the present invention, a relatively simple operation of inserting the elastically deformable part into the through hole ensures that an electrical connection is established between the contact pins and the test board. Since the elastically deformable part in the through hole presses the through hole by an elastic resilient force, an improved electrical connection between the contact pins and the test board is established.

The present invention also provides an IC socket mounting mechanism for mounting, on a test board, an IC socket comprising a contact unit having a plurality of straight contact pins for electrically connecting the test board and projection electrodes of a semiconductor device and also having a supporting structure for supporting the plurality of contact pins, the test board included in the IC socket mounting mechanism being provided with through holes at a pitch greater than a pitch at which the projection electrodes are arranged, and each of the plurality of contact pins is configured to be long enough to extend from the supporting structure to reach an associated one of the through holes formed in the test board.

According to the IC socket mounting mechanism described above, the through holes can be arrayed at a relatively wide pitch even if the pitch at which the projection electrodes are arrayed is relatively small. Thus, forming of the through holes becomes easier, and forming of the wiring pattern provided on the test board for connection with the through holes also becomes easier.

The aforementioned may also be attained by an IC test system for testing a semiconductor device mounted on an IC socket which is mounted on a test board connected to a test device, the IC socket being constructed such that a diameter of a plurality of straight pins having a first end electrically connected to the test board and a second end thereof connected to the projection electrodes is sufficiently small for each of the plurality of contact pins to pierce the projection electrodes, the IC socket being electrically connected to the test board by the first, end of the plurality of contact pins piercing the projection electrodes.

The present invention further provides an IC test system for testing a semiconductor device mounted on an IC socket which is mounted on a test board connected to a test device, said IC socket comprising: a plurality of straight contact pins having a first end electrically connected to said test board and another end connected to said projection electrodes; and a supporting structure for supporting said plurality of contact pins, each of said plurality of contact pins provided at the second end with a deformable part deformable according to a pressure occurring between said contact pin and an associated one of said projection electrodes.

According to the IC test system of the present invention, the reliability of the test on a semiconductor device can be improved because an electrical connection between the projection electrodes of the semiconductor device and the contact pins of the IC socket can be properly established.

BRIEF DESCRIPTION OF THE DRAWINGS

Other objects and further features of the present invention will be apparent from the following detailed description when read in conjunction with the accompanying drawings, in which:

FIG. 19 is a partial enlarged view of an IC socket according to a fifth embodiment of the present invention;

FIGS. 20A–20C show configurations of an upper end of a contact pin;

FIGS. 24A–24C show variations of an IC socket mounting mechanism; and

DESCRIPTION OF THE PREFERRED EMBODIMENTS

Figure 1:
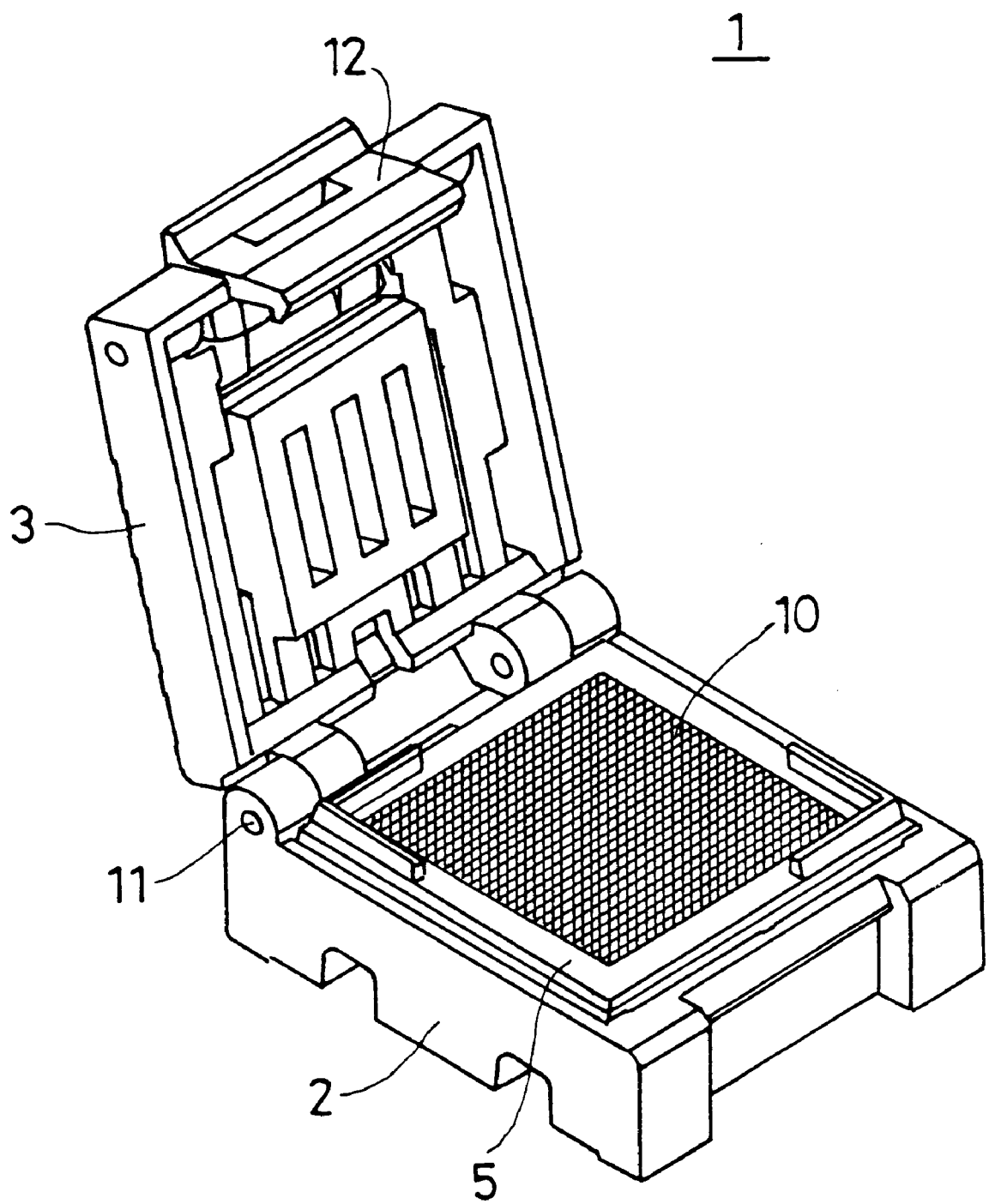
FIG. 1 is a perspective view of a conventional IC socket.
Figure 2:
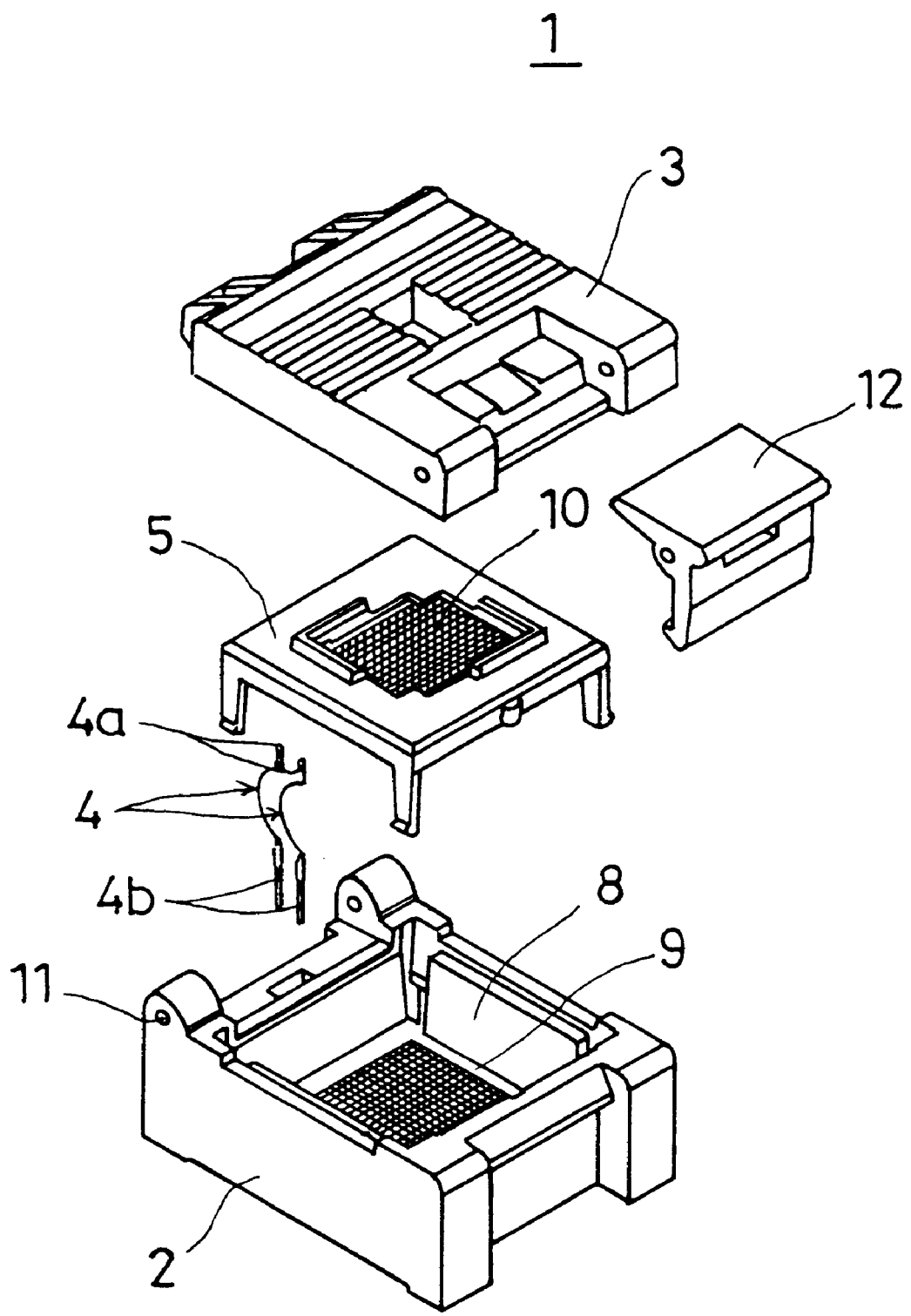
FIG. 2 is an exploded perspective view of the conventional IC socket.
Figure 3:
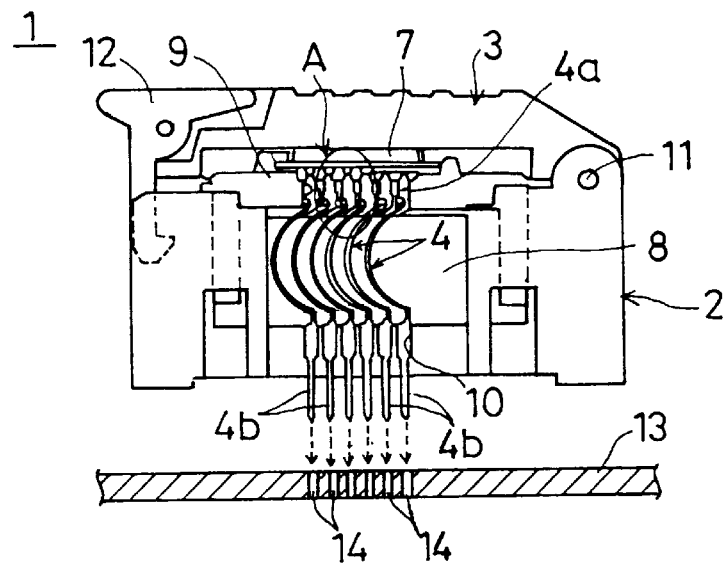
FIG. 3 is a sectional view of the conventional IC socket.
Figure 4:
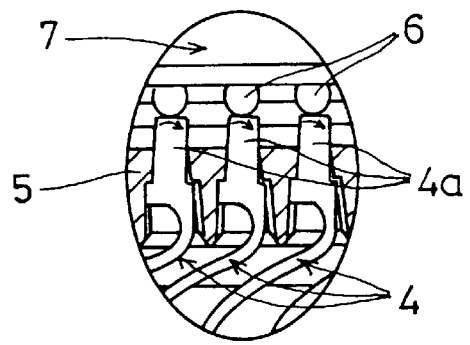
FIG. 4 is an enlarged view of a portion of FIG. 3.
Figure 5:
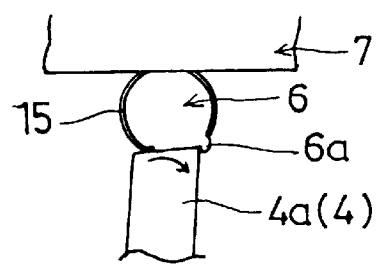
FIG. 5 illustrates a problem with the conventional IC socket.
Figure 6:
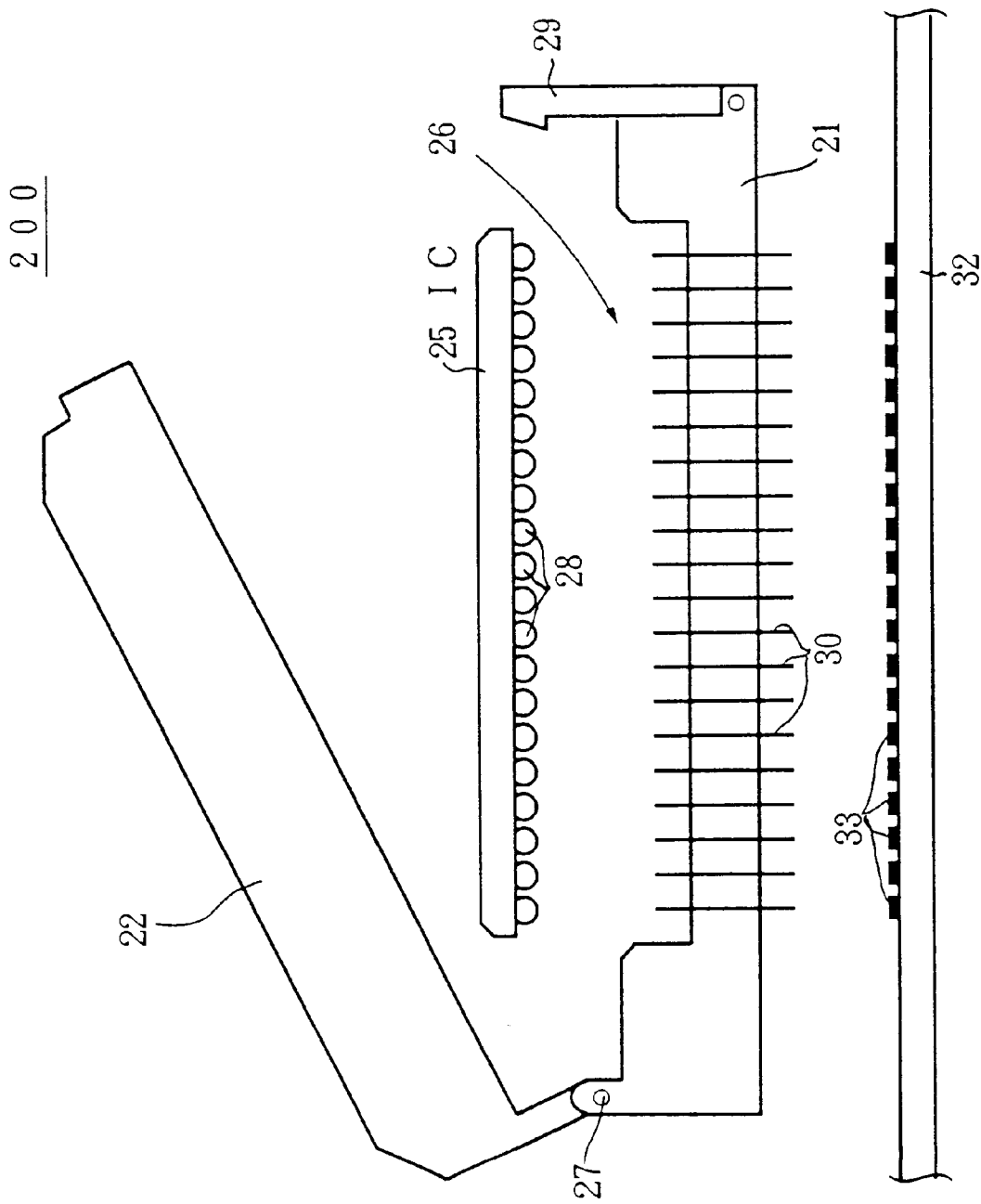
FIG. 6 shows a basic construction of an IC socket according to the present invention.

FIG. 6 shows a basic construction of an IC socket 200 according to the present invention. Referring to FIG. 6, the IC socket 200 comprises a socket body 21, a lid 22 and contact pins 30. The IC socket 200 accommodates a semiconductor device 25 (IC) of a BGA type provided with projection electrodes 28 so as to test the IC 25.

While the description given below assumes that the projection electrodes are embodied by solder bumps, the present invention may be applied to other types of projection electrodes. More specifically, the present invention may be applied to ICs having wire bumps, bumps formed by plating, etc.

The socket body 21 is formed of a molded resin. A cavity 26 is formed inside the socket body 21. The contact pins 30 are arrayed in the cavity 26.

The lid 22 is pivotably fitted to the socket body 21 by a pivot part 27. When the lid 22 is closed after the IC 25 is mounted on the socket body 21, the lid 22 acts to press the IC 25 toward the contact pins 30. Accordingly, the solder bumps 28 formed in the IC 25 are pressed against the contact pins 30 so that the contact pins 30 are electrically connected to the solder bumps 28. The lid 22 is provided with a lock lever 29 for causing the lid 22 to be locked in a closed position.

The IC socket 200 having the above described construction is mounted on a test board 32 connected to a test device (for example, a burn-in test device) for testing the IC 25. More specifically, IC socket 200 is mounted on the test board 32 such that the contact pins 30 projecting from the underside of the socket body 21 are pressed against land parts 33 formed on the test board 32. Thus, the lower ends of the contact pins 30 are electrically connected to the land parts 33. The IC socket 200 may be secured to the test board 32 by an adhesive or by screws.

In the above-described construction, the contact pins 30 are embodied by metal wires instead of being formed by punching a thin plate as is done in the conventional IC socket. Another point of note is that the contact pins 30 have a straight configuration instead of the conventional crooked configuration. Since the contact pins 30 are straight, the contact pins 30 can be formed by cutting metal wires in a predetermined length. Since such a process does not require a die, the cost of production can also be reduced.

It is necessary for the contact pins 30 to be harder than the solder bumps 28 formed in the IC 25 and to provide a certain spring action as described later. The contact pins 30 may preferably be formed of a tungsten that provides a good spring action or a beryllium copper having a favorable electric characteristic.

The diameter (L1) of the contact pins 30 is designed to be $1/5$–$1/10$ of the diameter (L2) of the solder bumps 28 (projection electrodes) (L1/L2 =$1/5$–$1/10$). More specifically, when the diameter L2 of the solder bumps 28 is 500 $\mu$m, the diameter L1 of the contact pins 30 is set in the range of 100–50 $\mu$m. Thus, the contact pins 30 of the IC socket 200 have a significantly smaller diameter than the diameter of the solder bumps 28.

A description will now be given of the operation and function of the IC socket 200 having the above construction. The IC 25 is mounted on the IC socket 200 by being fitted inside the cavity 26 of the socket body 21. When the IC 25 is fitted inside the cavity 26, the lid 22 is closed and secured to the closed position by the lock lever 29. Once the IC 25 is mounted on the IC socket 200, the IC 25 is pressed hard toward the contact pins 30.

As has been described above, the contact pins 30 are formed of a material harder than the material forming the solder bumps 28. Moreover, the diameter L1 of the contact pins 30 is configured to be significantly smaller than the diameter L2 of the solder bumps 28 such that L1 is ⅕–⅒ of L2. Accordingly, the upper ends of the contact pins 30 pierce the solder bumps 28 as the IC 25 is pressed against the contact pins 30. consequently, an electrical connection is established between the contact pins 30 and the solder bumps 28.

The surface of the solder bumps 28 usually has an insulating film (oxide film) 34 formed thereon. By the contact pins 30 piercing the insulating film 34, the contact pins 30 can properly establish an electric connection with the solder bumps 28.

Since the diameter of the contact pins 30 is significantly small as described already, only a small hole is created in the solder bumps 28 when the contact pins 30 pierce the solder bumps 38. The solder bumps 28 are not substantially deformed to the extent that a variation in the height of the adjacent solder bumps 28 results. Accordingly, the IC 25 can be mounted on the circuit board with high precision after the test.

Figure 7:
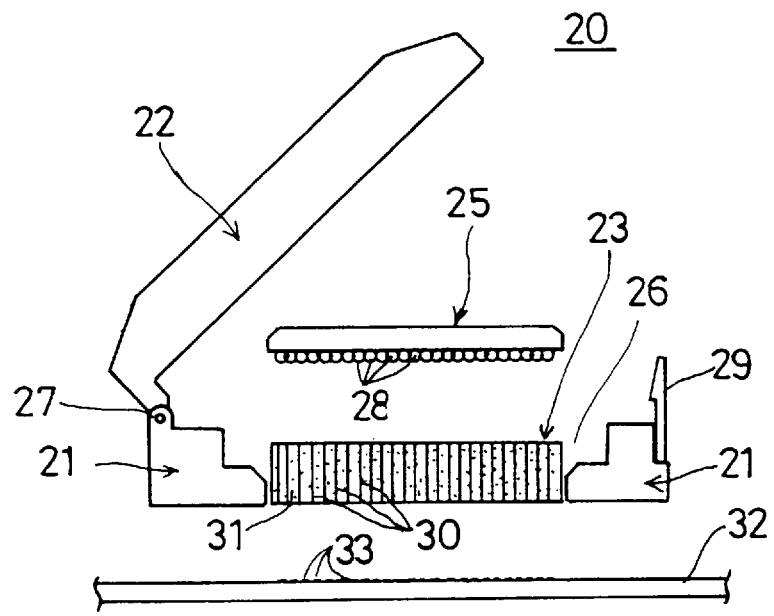
FIG. 7 is a schematic illustration of a construction of the IC socket according to a first embodiment of the present invention.
Figure 8:
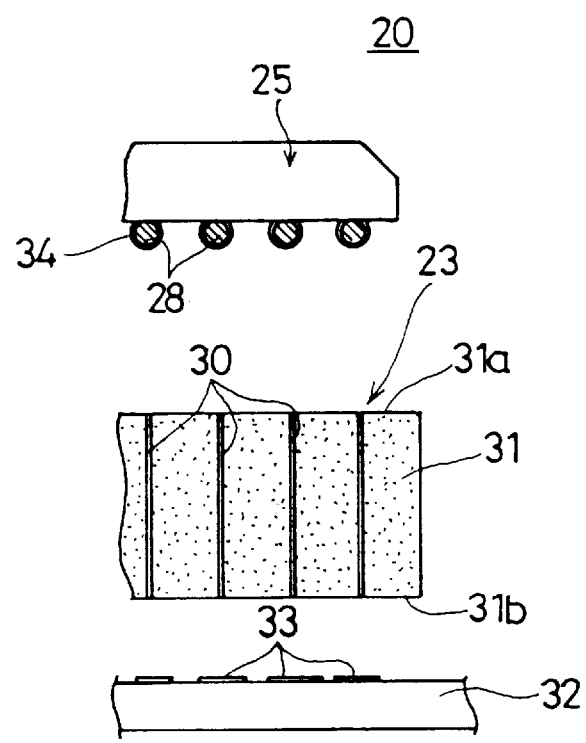
FIG. 8 is a partial enlarged view of the IC socket according to the first embodiment before an IC is mounted on the IC socket.
Figure 9:
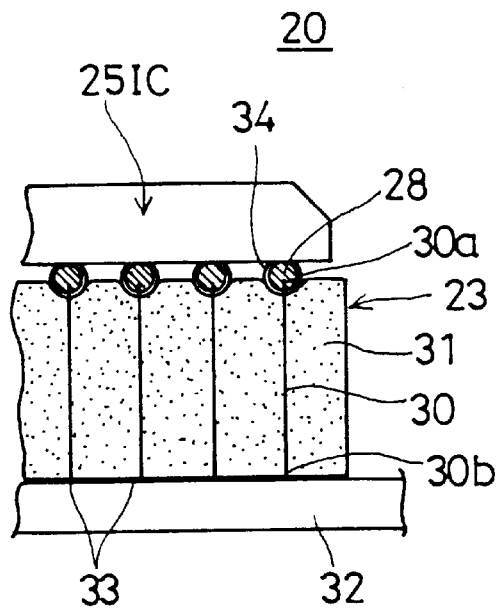
FIG. 9 is a partial enlarged view of the IC socket according to the first embodiment after the IC is mounted on the IC socket.

A description will now be given of specific embodiments of the present invention featuring the basic construction described above. FIGS. 7–9 show an IC socket 20 according to a first embodiment of the present invention. In FIGS. 7–9, those components that correspond to the components of the IC socket 200 shown in FIG. 6 are designated by the same reference numerals.

As shown in FIGS. 7–9, the IC socket 20 comprises the socket body 21, the lid 22 and a contact unit 23.

The socket body 21 is formed of a molded resin and the cavity 26 is formed inside the socket body 21. The contact unit 23 is designed to be fitted in the cavity 26. As shown in FIGS. 7–9, the first embodiment features the contact unit 23 which is separate from the socket body 21 so that the construction and the constituting material of the contact unit 23 and the socket 21 may be adapted for the respective required functions.

The cavity 26 is provided with a holding mechanism (not shown) for holding the contact unit 23. The holding mechanism secures the contact unit 23 in the socket body 21. The lid 22 is pivotably fitted to the socket body 21 by the pivot part 27. When the lid 22 is closed after the IC 25 is mounted on the socket body 21, the lid 22 presses the IC 25 toward the contact unit 23.

Accordingly, the solder bumps 28 formed in the IC 25 are pressed toward the contact unit 23 so that the contact pins 30 constituting the contact unit 23 are electrically connected to the solder bumps 28, as described later. The lock lever 29 provided in the lid 22 locks the lid 22 to the closed position.

The IC socket 20 having the above described construction is mounted on the test board 32 connected to a test device (for example, a burn-in test device) for testing the IC 25. More specifically, the IC socket 20 is mounted on the test board 32 such that the contact unit 23 exposed from the underside of the socket body 21 is pressed against the land part 33 formed in the test board 32, the contact pins 30 are connected to the land part 33.

A description will now be given of the contact unit 23, the feature of the first embodiment. The contact unit 23 comprises the contact pins 30 and an elastic member 31 (indicated by a sattin finished texture) for supporting the contact pins 30.

The contact pins 30 are formed of straight metal wires. Since the contact pins 30 are straight, the contact pins 30 can be formed by cutting metal wires in a predetermined length. Since such a process does not require a die, the cost of production can also be reduced.

The contact pins 30 are formed of a material which is harder than the solder bumps 28 formed in the IC 25 and which provides a certain spring action described later. For example, the contact pins 30 are formed of a tungsten that provides a good spring action or a beryllium copper having a favorable electrical characteristic.

The diameter (L1) of the contact pins 30 is set to be ⅕–⅒ of the diameter (L2) of the solder bumps 28 (projection electrodes) (L1/L2 =⅕–⅒). More specifically, assuming that the diameter L2 of the solder bumps 28 is 500 μm, the diameter L1 of the contact pins 30 is set in the range of 100–50 μm. Thus, the diameter of the contact pins 30 is made to have a significantly smaller diameter than the solder bumps 28.

The elastic member 31 for supporting the contact pins 30 may be formed of a material capable of elastic deformation such as a foam rubber, a foam glass or a styrene foam. The contact pins 30 are arrayed in the elastic member 31 so as to be aligned with the respective solder bumps 28. The contact pins 30 stand embedded in the elastic member 31 such that the upper ends thereof are flush with an upper surface 31a of the elastic member 31. Also, the lower ends of the contact pins 30 are flush with a lower surface 31b of the elastic member 31.

By using the elastic member 31 and by supporting the contact pins 30 by embedding the contact pins 30 in the elastic member 31, the contact pins 30 are properly supported over the entirety thereof.

A description will now be given, primarily with reference to FIGS. 8 and 9, of the operation and function of the IC socket 20 having the above described construction. In FIGS. 8 and 9, illustration of the socket body 21 and the lid 22 is omitted.

FIG. 8 shows a state before the IC 25 is mounted on the IC socket 20. As shown in FIG. 8, the elastic member 31 is not deformed before the IC 25 is mounted on the IC socket 20, that is, when the IC 25 is removed from the contact unit 23. In this state, the contact pins 30 stand erect by being supported by the elastic member 31.

The IC 25 is mounted on the IC socket 20 such that the IC 25 is first placed on a predetermined mounting position on the contact unit 23 (at which position the solder bumps 28 are aligned with the corresponding contact pins 30). Subsequently, the lid 22 is closed and the lock lever 29 is operated to lock the lid 22 in the closed position. The IC 25 mounted on the IC socket 20 is pressed hard toward the contact unit 23.

As described above, the contact pins 30 are formed of a material which is harder than the material forming the solder bumps 28. The diameter L1 of the contact pins 30 is configured to be ⅕–⅒ of the diameter L2 of the solder bumps 28. Accordingly, as the IC 25 is pressed toward the contact unit 23, upper ends 30a of the contact pins 30 pierce the solder bumps 28 as shown in FIG. 9.

Accordingly, the contact pins 30 and the solder bumps 28 are electrically connected to each other.

The IC socket 20 according to the first embodiment has the following added effects compared to the IC socket having the basic construction.

Since the upper ends 30a of the contact pins 30 are flush with the upper surface 31a of the elastic member 31, the contact pins 30 pierce the solder bumps 28 so that the solder bumps 28 press the upper surface 31a of the elastic member 31. Since the elastic member 31 is elastically deformable, the elastic member is deformed elastically by being pressed by the solder bumps 28. Accordingly, the elastic member 31 is prevented from blocking the electrical connection between the contact pins 30 and the solder bumps 28.

Even with their significantly small diameter, the contact pins 30 are prevented from being bent or broken because the contact pins are supported by the elastic member 31 constituting the contact unit 23. Therefore, the electrical connection with the solder bumps 28 can be properly established.

A description will now be given of a second embodiment of the present invention.

Figure 10:
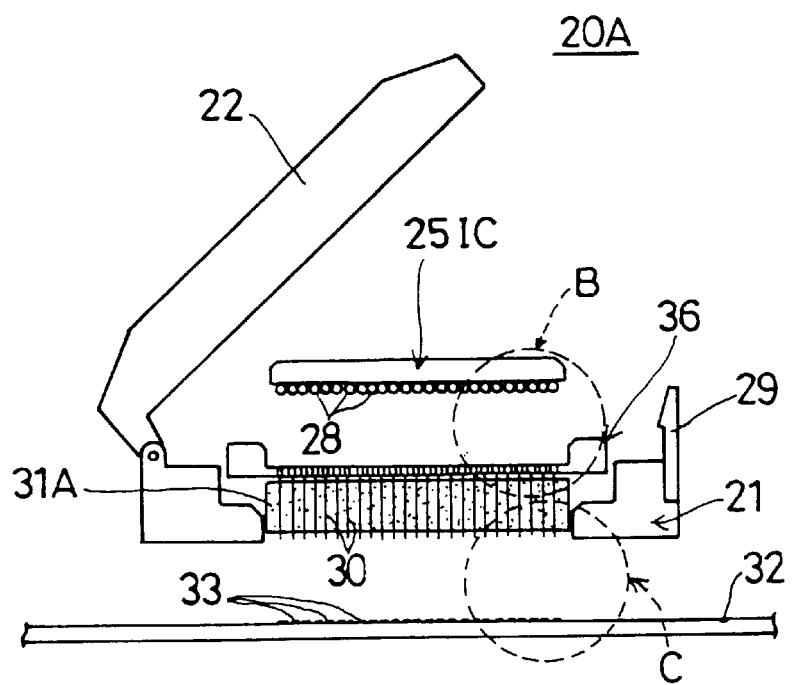
FIG. 10 is a schematic view of an IC socket according to a second embodiment of the present invention.
Figure 11:
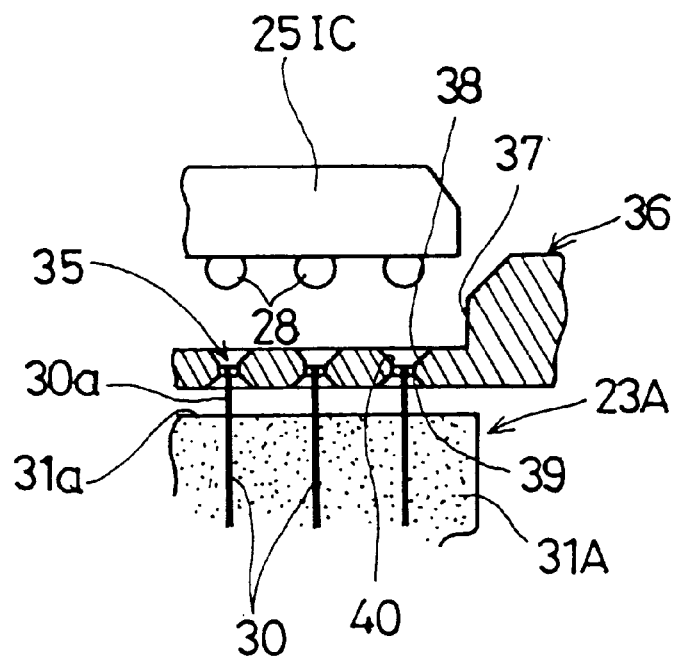
FIG. 11 is an enlarged view of a part indicated by the arrow B of FIG. 10.
Figure 12:
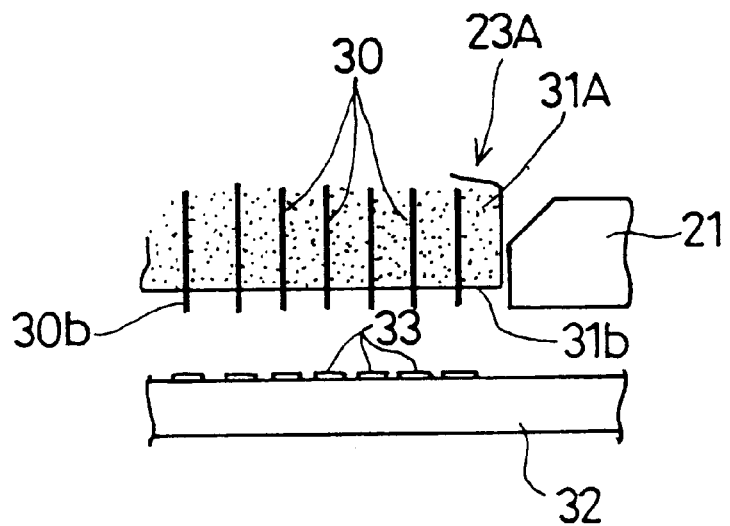
FIG. 12 is an enlarged view of a part indicated by the arrow C of FIG. 10.

FIGS. 10–12 show an IC socket 20A according to a second embodiment of the present invention. In FIGS. 10–12, those components that are the same as the components of the IC socket 20 according to the first embodiment described with reference to FIGS. 7–9 are designated by the same reference numerals, and the description thereof is omitted.

In the IC socket 20 according to the first embodiment, the contact pins 30 constituting the contact unit 23 are completely embedded in the elastic ember 31 so that only the ends of the contact pins 30 re exposed in the upper surface 31a and the lower surface 31b of the elastic member 31. The solder bumps 28 are connected to the contact pins 30 such that as the elastic member 31 is elastically deformed by the solder bumps 28, the contact pins 30 pierce the solder bumps 28.

While the construction of the first embodiment ensures that the contact pins 30 pierce the solder bumps 28, an elastic resilient force produced as the elastic member 31 is elastically deformed acts to remove the solder bumps 28 away from the contact pins 30. This action also occurs in the connection between the elastic member 31 and the test board 32. Thus, the elastic member 31 may obstruct an electric connection between the solder bumps 28 and the contact pins 30, and between the test board 32 and the contact pins 30.

An elastic member 31A of the second embodiment has portions thereof in the vicinity of the ends of the contact pins 30 removed so that the upper ends 30a and the lower ends 30b of the contact pins 30 project from the surface of the elastic member 31A. The upper ends 30a and the lower ends 30b of the contact pins 30 may be caused to project from the respective surfaces of the elastic member 31A by removing the upper surface 31a and the lower surface 31b of the elastic member 31 to a certain depth or by performing a suitable mechanical or chemical process.

By removing a portion of the upper surface 31a and the lower surface 31b of the elastic member 31A so that the upper ends 30a and the lower ends 30b of the contact pins 30 project from the elastic member 31A, the elastic member 31 is prevented from obstructing a connection between the solder bumps 28 and the contact pins 30 and between the test board 32 (the land part 33) and the contact pins 30. Thus, an electrical connection between the IC 25 and the IC socket 20A and between the IC socket 20A and the test board 32 can be properly established.

It is not necessary to reduce both the upper surface 31a and the lower surface 31b of the elastic member 31A in the vicinity of the contact pins 30. Only one of the upper surface 31a and the lower surface 31b may be reduced.

Another feature of the IC socket 20A according to the second embodiment is that a positioning plate 36 is provided in the contact unit 23 in addition to the contact pins 30 and the elastic member 31A. The positioning plate 36 is formed of an insulating material such as a glass or a resin like polyimide.

The positioning plate 36 is provided on the upper surface of the elastic member 31A. The positioning plate 36 is provided with through holes 35 that guide the contact pins 30 inserted therein and properly positions the contact pins 30. The through holes 35 are aligned with the solder bumps 28 of the IC 25. By inserting the contact pins 30 through the through holes 35, the contact pins 30 are positioned so as to be aligned with the solder bumps 28. The through holes 35 are formed in the bloc using, for example, etching technology because the through holes 35 must be aligned with the solder bumps 28 with a high precision.

By providing the positioning plate 36, the contact pins 30 and the solder bumps 28 can be properly positioned with respect to each other when the IC 25 is mounted on the IC socket 20A.

The background for the second embodiment is that the upper ends 30a and the lower ends 30b of the contact pins 30 may be displaced relatively freely if the contact pins 30 are supported only by the elastic member 31A so that the contact pins 30 and the solder bumps 28 may not be properly positioned with respect to each other when the IC 25 is mounted on the IC socket 20A. The positioning plate 26 of the second embodiment ensures that the contact pins 30 are properly positioned so that the contact pins 30 and the solder bumps 28 are properly connected to each other.

As shown in FIG. 11, an IC positioning part 37 (mounting positioning part as claimed) for positioning the IC 25 properly is provided in that part of the positioning plate 36 where the IC 25 is mounted. The IC 25 is properly positioned by its periphery engaging with the IC positioning part 37. By merely mounting the IC 25 on the IC positioning part 37, the IC 25 can be positioned in the IC socket 20A with a high precision. Accordingly, an electrical connection between the contact pins 30 and the solder bumps 28 can be properly established.

Positioning recesses 38 (electrode positioning part as claimed) for positioning the solder bumps 28 are formed on the upper surface of the positioning plate 36 shown in FIG. 11 so as to be opposite to the solder bumps 28. The positioning recesses 38 are formed to be aligned with the through holes 35. The positioning recesses 38 have a conical configuration for proper engagement with corresponding portions of the generally spherical solder bumps 28.

When the IC 25 is mounted, the solder bumps 28 are properly positioned by being engaged with the positioning recesses 38. As has been described, since the positioning plate 36 also positions the contact pins 30, the positioning of the contact pins 30 with respect to the solder bumps 28 is performed with a high precision. Therefore, an electrical connection between the solder bumps 28 and the contact pins 30 can be properly established.

Conical guide recesses 39 for guiding he contact pins 30 inserted therein are formed on the power surface of the positioning plate 36 so as to be aligned with the through holes 35. The contact pins 30 are guided by the guide recesses 39 and properly inserted in the through holes 35. A large number of contact pins 30 can be easily inserted in the through holes 35 with a relatively small diameter so that the mounting process can be performed efficiently.

A plating 40 formed of a conductive material is formed in the inner walls of the through holes 35 and the guide recesses 39 for proper electrical contact with the contact pins 30. The plating 40 is also formed in the positioning recesses 38 for proper electrical contact with the solder bumps 28. Accordingly, the plating 40 serves to establish an electrical connection between the contact pins 30 and the solder bumps 28.

More specifically, the contact pins 30 come into contact with the plating 40 and are electrically connected therewith when inserted into the through holes 35. Since the plating 40 is also formed in the positioning recesses 38 which come into contact with the solder bumps 28, the plating 40 is electrically connected to the solder bumps 28. Accordingly, the effective contact surface between the contact pins 30 and the solder bumps 28 increases so that an electrical connection between the contact pins 30 and the solder bumps 28 can be more properly established.

A description will now be given of an alternative construction which ensures a proper connection between the contact pins 30 and the solder bumps 28.

Figure 13A:
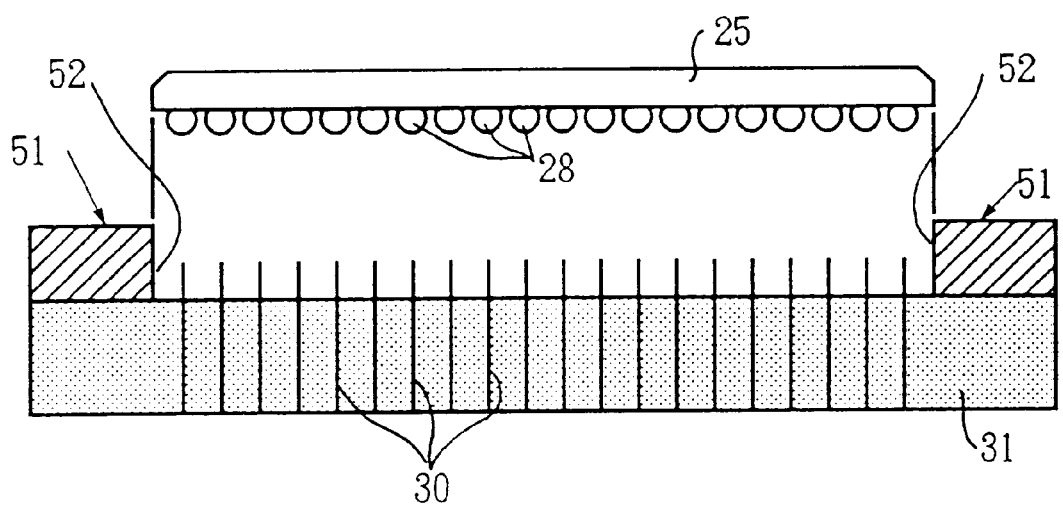
FIG. 13A shows how an IC is positioned in the supporting structure.

In the construction shown in FIG. 13A, an insulating member 51 provided with an IC positioning part 52 for positioning the IC 25 is formed in the elastic member 31 for supporting the contact pins 30. The insulating member 51 is formed of a resin (for example, a polyimide resin or the like) providing an electrical insulation. The IC positioning part 52 formed in the insulating member 51 is a rectangular opening in which the IC 25 is mounted.

By mounting the IC 25 on the IC positioning part 52, the IC 25 can be properly positioned with respect to the elastic member 31. Therefore, an electrical connection between the contact pins 30 and the solder bumps 28 formed in the IC 25 can be properly established.

Figure 13B:
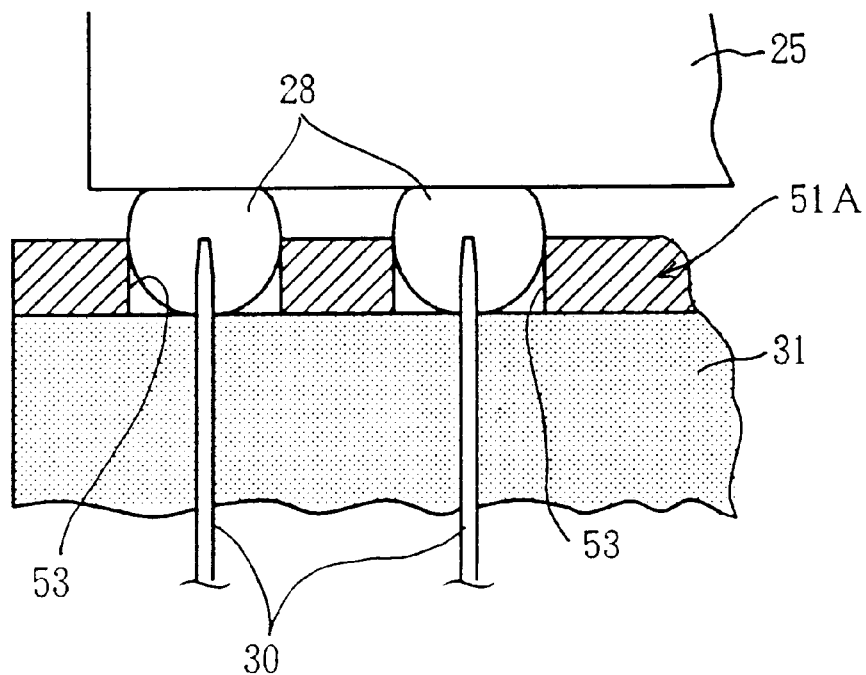
FIG. 13B is a partial enlarged view of FIG. 13A.

In the construction shown in FIG. 13B, the elastic member 31 is provided with an insulating member 51A in which a bump positioning part 53 is formed to accommodate the solder bumps 28 formed in the IC 25. By positioning the solder bumps 28 formed in the IC 25 so as to be fitted in the bump positioning part 53, the solder bumps 28 can be properly positioned with respect to the elastic member 31. Therefore, an electrical connection between the contact pins 30 and the solder bumps 28 can be properly established.

Figure 14A:
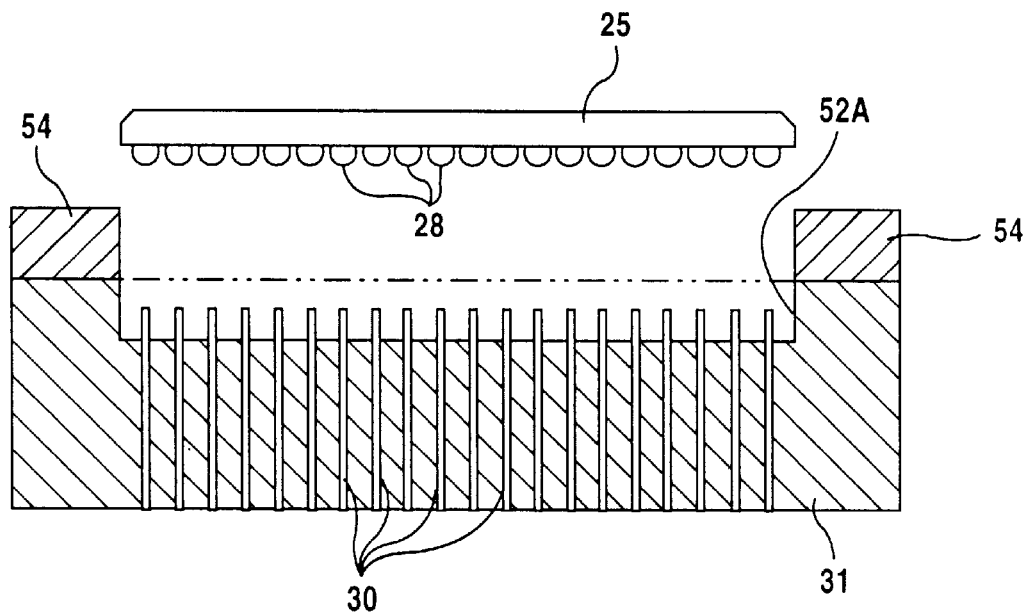
FIG. 14A shows how an IC is positioned in the supporting structure.

In the construction shown in FIG. 14A, an IC positioning part 52A for properly positioning the IC 25 is formed to be integral with the elastic member 31. The IC positioning part 52A may be formed by providing, on the elastic member 31, a mask 54 having an opening aligned with the IC mounting position so that a portion of the elastic member 31 is removed using chemical etching. While the mask 54 is shown in FIG. 14A, it is to be removed before the IC 25 is mounted on the IC positioning part 52A.

Like the construction shown in FIG. 13A, the construction shown in FIG. 18A also ensures that the IC 25 can be properly positioned with respect to the elastic member 31 just by mounting the IC 25 on the IC positioning part 52A. Therefore, an electrical connection between the contact pins 30 provided in the elastic member 31 and the solder bumps formed in the IC 25 can be properly established. Since the IC positioning part 52A is formed to be integral with the elastic member 31, the IC 25 can be positioned using a simple construction.

Figure 14B:
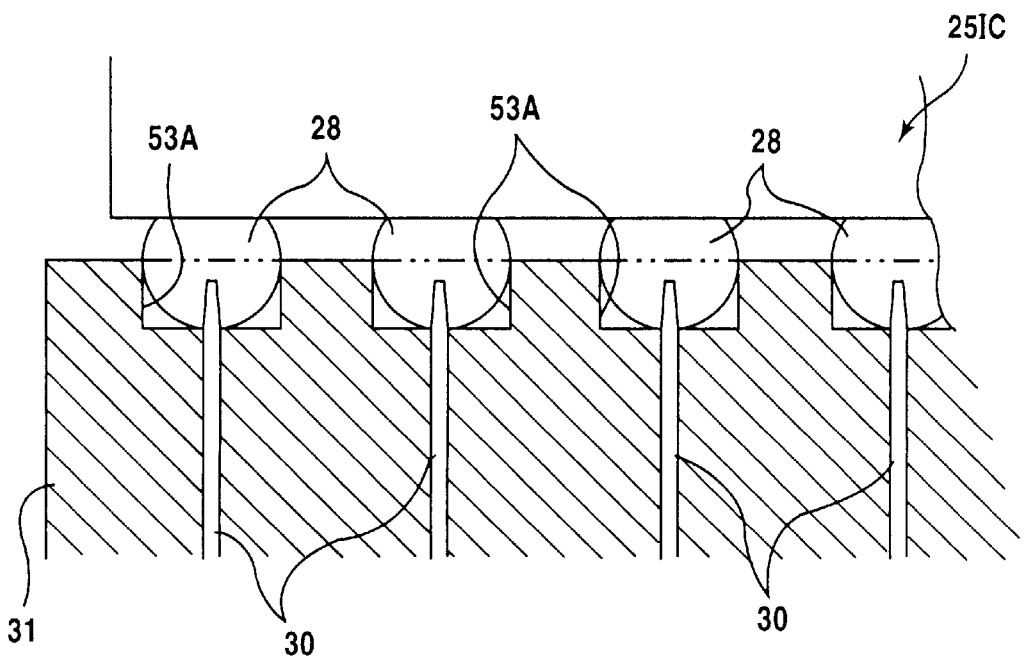
FIG. 14B is a partial enlarged view of FIG. 14A.

In the construction shown in FIG. 14B, a bump positioning part 53A for positioning the bumps 28 is formed to be integral with the elastic member 31. By mounting the solder bumps 28 formed in the IC 25 on the bump positioning part 53A, an electrical connection between the contact pins 30 and the solder bumps 28 can be properly established. Since the bump positioning part 53A is formed to be integral with the elastic member 31, the solder bumps 28 can be positioned using a simple construction.

A description will now be given of a third embodiment of the present invention.

Figure 15:
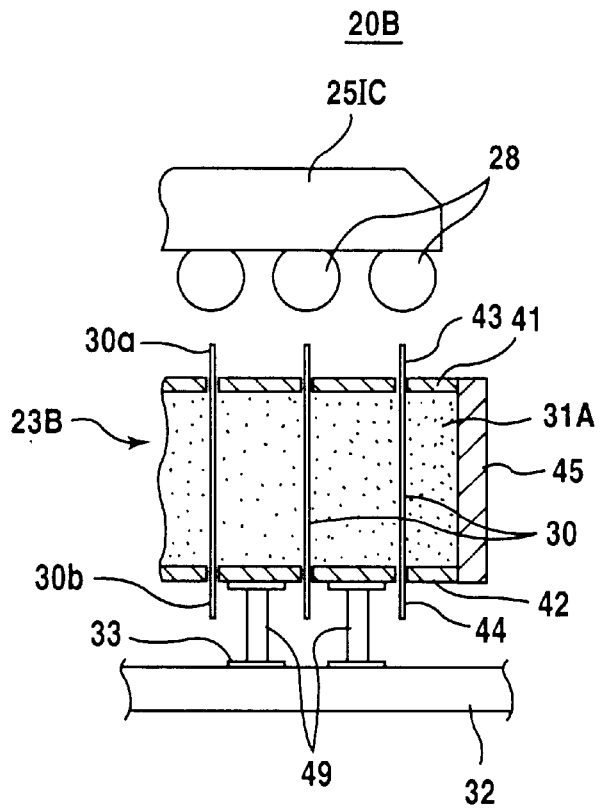
FIG. 15 is a partial enlarged view of an IC socket according to a third embodiment of the present invention.

FIG. 15 shows a portion of an IC socket 20B according to a third embodiment of the present invention. Illustration of the socket body 21 and the lid 22 is omitted. In FIG. 15, those components that are the same as the components of the IC socket 20 and 20A according to the first and second embodiments, respectively, are designated by the same reference numerals and the description thereof is omitted.

The IC socket 20B according to the third embodiment is constructed such that an upper guide plate 41 and a lower guide plate 42 are provided in a contact unit 23B to sandwich the elastic member 31A provided with the contact pins 30. The upper guide plate 41 and the lower guide plate 42 are provided with positioning holes 43 an 44, respectively, for positioning the contact pins 30. The contact pins 30 are movably guided by the positioning holes 43 and 44.

In order to prevent a relative displacement (dislocation) of the upper guide plate 41 and the lower guide plate 42, a dislocation preventing plate 45 is provided at the sides of the upper guide plate 41 and the lower guide plate 42. The upper end of the dislocation preventing plate 45 is fixed to the upper guide plate 41 and the lower end of the dislocation preventing plate 45 is fixed to the lower guide plate 42. Accordingly, a dislocation of the upper guide plate 41 and the lower guide plate 42 is prevented.

The third embodiment shows that the contact unit may have a pair of guide plates provided to sandwich the elastic member 31A instead of the positioning plate of the second embodiment provided on the upper surface of the elastic member 31A or instead of an alternative guide plate provided on the lower surface thereof. According to the construction of the third embodiment, the contact pins 30 are positioned at the upper and lower ends thereof so that an electrical connection between the solder bumps 28 and the contact pins 30 and between the test board 32 (the land part 33) and the contact pins 30 can be properly established.

Figure 16:
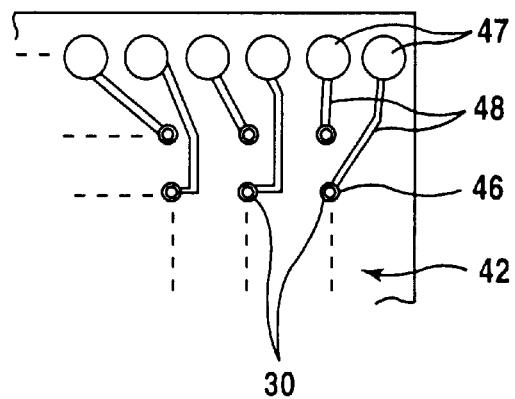
FIG. 16 is a bottom view of a guide plate provided in the IC socket according to the third embodiment.

FIG. 16 is a bottom view of the lower guide plate 42 provided on the lower surface of the elastic member 31A. As shown in FIG. 16, connection parts 46, land parts 47 and lead parts 48 are printed on that surface of the lower guide plate 42 that faces the test board 32. The connection parts 46 are electrically connected to the contact pins 30. For example, the connection parts 46 may be through hole electrodes formed in the positioning holes 44. Therefore, the connection parts 46 are provided at the same pitch as the pitch of the contact pins 30 (and the pitch of the solder bumps 28).

The land parts 47 may be formed at a pitch wider than the pitch of the connection parts 46 because the arrangement of the land parts 47 is not determined by the arrangement of the contact pins 30. The lead parts 48 electrically connect the connection parts 46 and the land parts 47.

Since the arrangement of the connection parts 46 is determined by the arrangement of the contact pins 30, the pitch of the connection parts 46 can not be enlarged. However, the lead parts 48 according to the third embodiment for leading the connection parts 46 to the land parts 47 ensures that the pitch of the connection parts 46 is virtually enlarged so as to be equal to the pitch of the land parts 47.

Accordingly, as shown in FIG. 8, by providing the land parts 47 with external connection terminals 49 for connection with the test board 32, an electrical connection between the test board 32 and the IC socket 20B can be easily and properly established.

A description will now be given of a fourth embodiment of the present invention.

Figure 17:
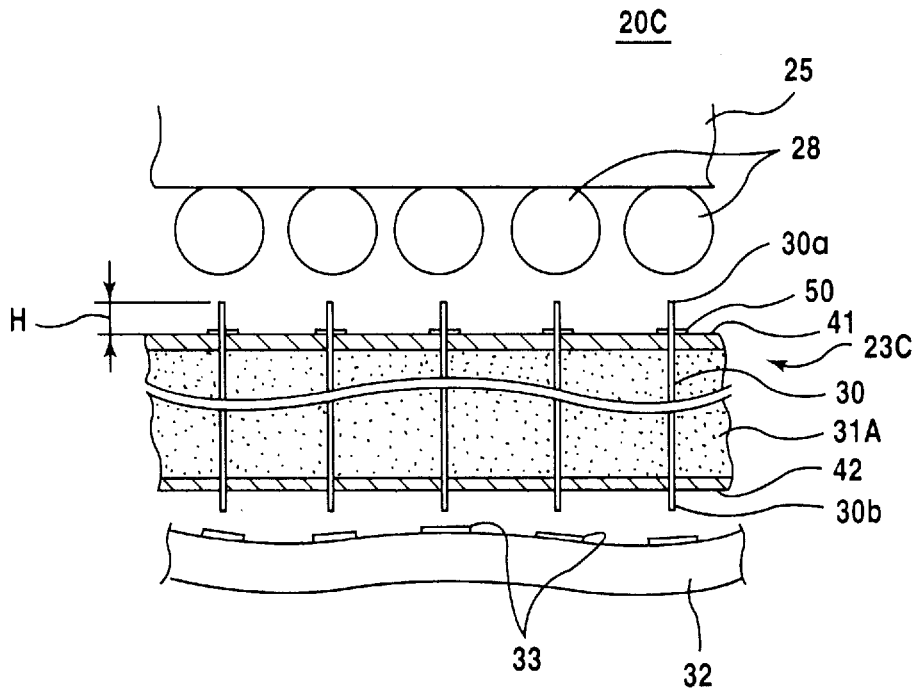
FIG. 17 is a partial enlarged view of an IC socket according to a fourth embodiment of the present invention.
Figure 18:
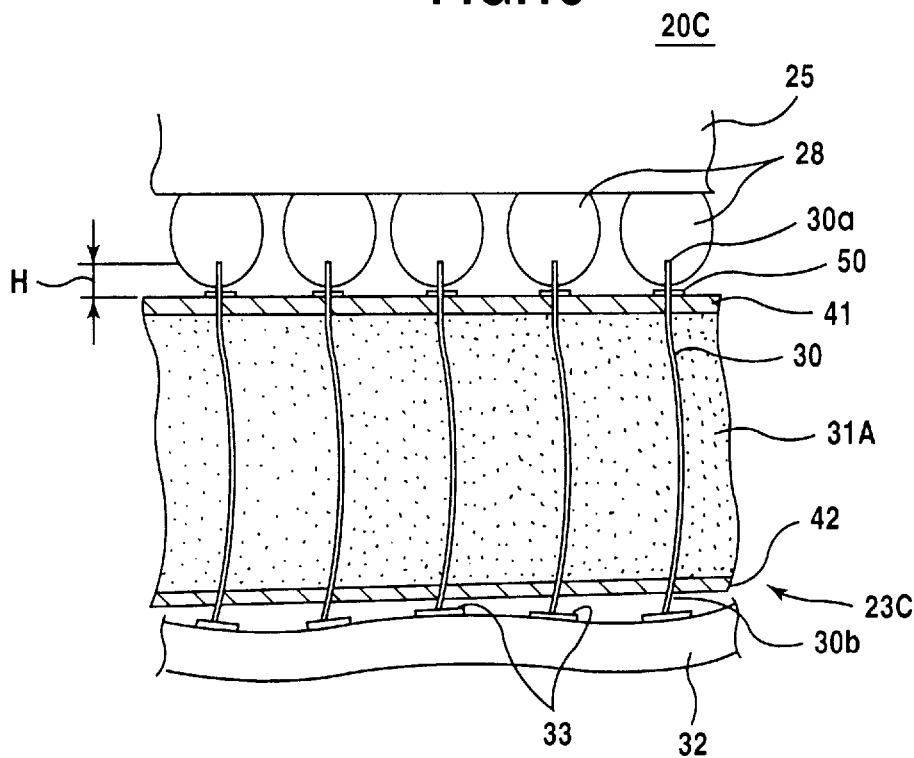
FIG. 18 is a partial enlarged view showing an operation of the IC socket according to the fourth embodiment of the present invention.

FIGS. 17 and 18 are schematic views of an IC socket 20C according to the fourth embodiment. Illustration of the socket body 21 and the lid 22 is omitted. In FIGS. 17 and 18, those components that are identical to the components of the IC socket 20B according to the third embodiment shown in FIG. 15 are designated by the same reference numerals and the description thereof is omitted.

The feature of the IC socket 20C according to the third embodiment is that the contact pins 30 provided in a contact unit 23C are fixed to the upper guide plate 41 such that their heights from the surface of the guide plate 41 are uniform. Referring to FIG. 17, the contact pins 30 are made to have the regular height H from the surface of the upper guide plate 41. The contact pins 30 may be fixed to the upper guide plate 41 using, for example, an adhesive 50. By using the adhesive 50, the contact pins 30 and the upper guide plate 41 become integral with each other. The contact pins 30 are not fixed to the lower guide plate 42 provided on the lower surface of the elastic member 31A. The construction involving the contact pins 30 and the lower guide plate 42 are the same as the corresponding construction according to the third embodiment.

As described above, by fixing the contact pins 30 to the upper guide plate 41, a variation in the height of the upper ends 30a of the contact pins 30 connected to the solder bumps 28 can be prevented.

A case is assumed in which the contact pins 30 are movable with respect to the upper guide plate 41 (that is, assuming the construction of the third embodiment), and in which the test board 23 is warped as shown in FIGS. 17 and 18. As described in the foregoing embodiments, since the lower ends 30b of the contact pins 30 come into contact with the test board 32 and are electrically connected thereto, a variation in the height of the upper ends 30a of the contact pins 30 conforming to the configuration of the test board 32 occurs.

If a variation in the height of the upper ends 30a of the contact pins 30 occurs, the depth of the contact pins 30 piercing the solder bumps 28 differs from pin to pin. Accordingly, a variation in the conductivity occurs and the test may not be successfully conducted.

By fixing the contact pins 30 to the upper guide plate 41 in a uniform height from the surface of the upper guide plate 41 according to the fourth embodiment, the upper ends 30a of the contact pins 30 are maintained at the uniform height H from the upper guide plate 41 even when the test board 32 does not have a level surface due to a warp or the like. Therefore, as shown in FIG. 18, the contact pins 30 pierce the solder bumps 28 to the regular depth so that the electrical conductivity between the contact pins 30 and the solder bumps 28 is stabilized.

The contact pins 30 are inserted through the positioning holes 44 of the lower guide plate 42 so as to be displaceable therein. The contact pins 30 and the elastic member 31A supporting the contact pins 30 are elastically deformable. For this reason, even when the test board 32 has a rugged surface due to a warp or the like, the contact pins 30 and the elastic member 31A are elastically deformed below the upper guide plate 41. Accordingly, the contact pins 30 can be properly connected to the land parts 33 formed on the test board 32 when the contact pins 30 are fixed to the upper guide plate 41 at the prescribed positions thereof.

The depth to which the contact pins 30 pierce the solder bumps 28 is determined by the height H of the contact pins 30 projecting above the upper guide plate 41. That is, when the solder bumps 28 come into contact with the upper guide plate 41, the contact pins 30 do not penetrate the solder bumps 28 further. In this way, it is possible to prevent the contact pins 30 from piercing the solder bumps 28 beyond a required depth. Thus, the solder bumps 28 are prevented from being damaged and the main body of the IC 25 is prevented from being damaged by the contact pins 30 piercing the solder bumps 28.

While it is assumed that only the contact unit 23C is provided in the IC socket 20C of the fourth embodiment described with reference to FIGS. 17 and 18, it is also possible to provide the positioning plate 36 described with reference to FIGS. 10 and 11 in the IC socket 20C. A benefit added to the fourth embodiment by providing the positioning plate 36 is that the IC 25 can be positioned with a higher precision and the solder bumps 28 and the contact pins 30 are electrically connected to each other more properly.

A description will now be given of an IC socket according to a fifth embodiment.

FIG. 19 shows an IC socket 20D according to a fifth embodiment. In FIG. 15, those components that are identical to the components of the IC socket 20B according to the third embodiment described with reference to FIG. 15 are designated by the same reference numerals and the description will be omitted.

The IC socket 20D according to the fifth embodiment differs from the IC socket 20B according to the third embodiment shown in FIG. 15 in that the elastic member 31A and the dislocation preventing plate 45 are eliminated and the upper guide plate 41 and the lower guide plate 42 for supporting the contact pins 30 are provided.

The upper guide plate 41 is provided with supporting holes 56 in which the contact pins 30 are inserted and adhesively fixed, and the lower guide plate 42 is provided with supporting holes 57 in which the contact pins 30 are inserted. The upper guide plate 41 and the lower guide plate 42 are spaced apart so as to reside near the upper ends and the lower ends of the contact pins 30, respectively.

Therefore, only the contact pins 30 exist between the upper guide plate 41 and the lower guide plate 42. The contact pins 30 according to the fifth embodiment are not supported by the elastic member and are more easily displaced between the upper guide plate 41 and the lower guide plate 42 than the contact pins 30 of the foregoing embodiments.

Assuming that the contact pins 30 are supported in such a manner that it is impossible or difficult for the contact pins 30 to be displaceable, a variation in the electrical connection between the the contact pins 30 and the test board 32, and between the contact pins 30 and the solder bumps 28 occurs if the height of the solder bumps 28 formed on the IC 25 differs from bump to bump, or if the test board 32 does not have a level surface due to a warp or the like. If there is a variation in the electrical connection, an associated variation in the electrical conductivity occurs and the test may not be conducted properly.

In the IC socket 20D according to the fifth embodiment, since the contact pins 30 are easily displaceable between the upper guide plate 41 and the lower guide plate 42, the elastic deformation of the contact pins 30 cancels the variation in the height of the solder bumps 28 and the warp or the like of the test board 32. Accordingly, a proper electrical connection is established between the contact pins 30 and the solder bumps 28, and between the contact pins 30 and the test board 32, resulting in a stabilized electrical conductivity.

A description will now be given, with reference to FIGS. 20A–23C, of configurations of the ends of the contact pins 30 connected to the solder bumps 28 and the land parts 33 of the test board 32.

In the construction shown in FIGS. 20A and 20B, at least the ends of the contact pins 30 piercing the solder bumps 28 are formed as a sharp edge. FIG. 20A shows a conical sharp edge 60 provided at the end of the contact pin 30. FIG. 20B shows a diagonally cut sharp edge 61 at the end of the contact pin 30.

The conical sharp edge 60 and the diagonally cut sharp edge 61 may be formed by grinding, chemically treating or diagonally cutting the end of the contact pin 30 exposed from the elastic member. By forming the sharp edges 60 or the sharp edges 61 in the contact pins 30, it is easy for the contact pins 30 to pierce the solder bumps 28 and the damage caused in the solder bumps 28 can be reduced (the solder bumps 28 are deformed to a smaller degree).

In the construction shown in FIG. 20C, the contact pins 30 are provided with a plating 62 at its end. The plating 62 may be formed of gold (Au) or the like characterized by a good conductivity. By forming the plating 62 at the end of the contact pins 30, an electrical conductivity between the contact pins 30 and the solder bumps 28 pierced thereby can be improved.

While the contact pins 30 are configured to pierce the solder bumps 28 according to the foregoing embodiments, the contact pins 30 shown in FIGS. 21C–23C are configured to establish an electrical connection with the solder bumps 28 without piercing the solder bumps 28.

Figure 21A:
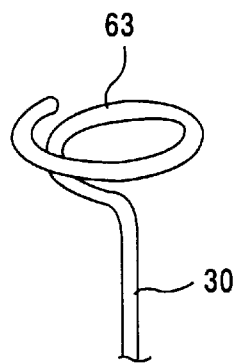
FIGS. 21A and 21B show configurations of an upper end of a contact pin.
Figure 21B:
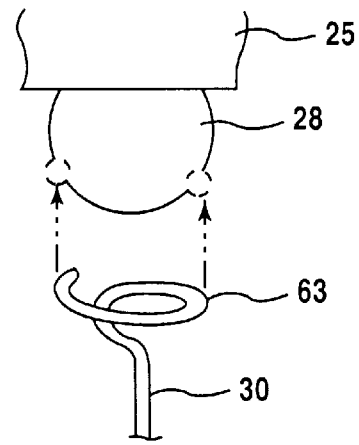

The construction shown in FIGS. 21A and 21B features a spiral part 63 formed at the end of the contact pins 30. The spiral part 63 is inherently displaceable in a longitudinal direction.

As shown in FIG. 21B, when the IC is mounted so that the solder bumps 28 formed thereon contact the spiral part 63, the solder bumps 28, characteristically formed of a soft material, are prevented from being damaged or deformed thanks to an elastic deformation of the spiral part 63. Further, the spiral part 63 comes into contact with the solder bump 28 at positions indicated by the circles drawn by the broken lines in FIG. 21B, which positions are removed from the lower end of the solder bump 28.

Since the lower end of the solder bump 28 is soldered to the board to which the IC 25 is mounted, any damage or deformation in the lower end may prevent the mounting process from being performed properly. By forming the spiral part 63 at the end of the contact pins 30 so that the contact pins 30 do not come into contact the lower end of the solder bumps 28, the lower end of the solder bumps 28 is prevented from being damaged or deformed when the IC is tested.

Figure 22A:
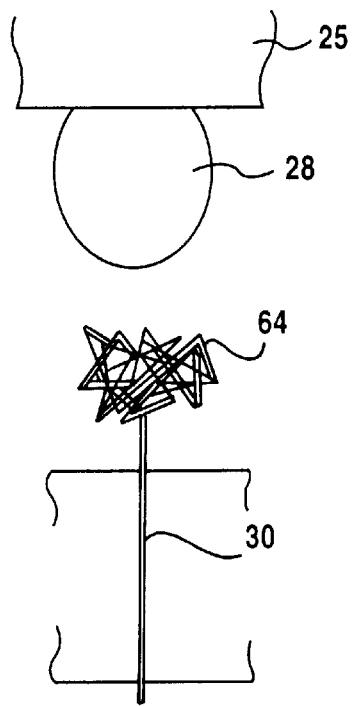
FIGS. 22A and 22B show configurations of an upper end of a contact pin.

In the construction shown in FIG. 22A, a randomly deformed part 64 is formed at the end of the contact pins 30 by bending the end in a random manner. By providing the randomly deformed part 64 at the end of the contact pins 30, the solder bumps 28 are encased in the randomly deformed part 64 and remain in contact therewith while the IC is being tested. The solder bumps 28, characteristically formed of a soft material, are prevented from being damaged or deformed, and an electrical connection therewith can be properly established.

Figure 22B:
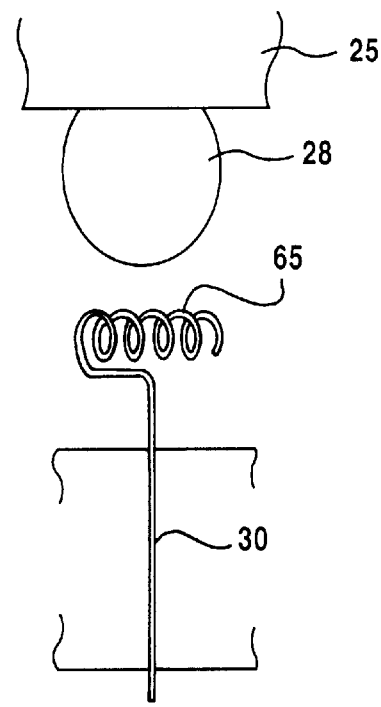

In the construction shown in FIG. 22B, a coil part 65 is produced at the end of the contact pins 30 so that the longitudinal direction of the coil part 65 is perpendicular to the longitudinal direction of the contact pins 30. By forming the coil part 65 at the end of the contact pins 30, the coil part 65 is deformed according to the configuration of the solder bumps 28 when the solder bumps 28 are pressed against the coil part 65 in testing the IC. Accordingly, the solder bumps 28 come into contact with the coil part 65 at a large number of points. Accordingly, an electrical connection between the solder bumps 28 and the contact pins 30 can be properly established.

Any variation in the height of the solder bumps 28 or the irregularity on the surface of the test board 32 can be canceled by a deformation of the coil part 65. In this way, an electrical conductivity between the solder bumps 28 and the contact pins 30 can be improved.

Figure 23A:
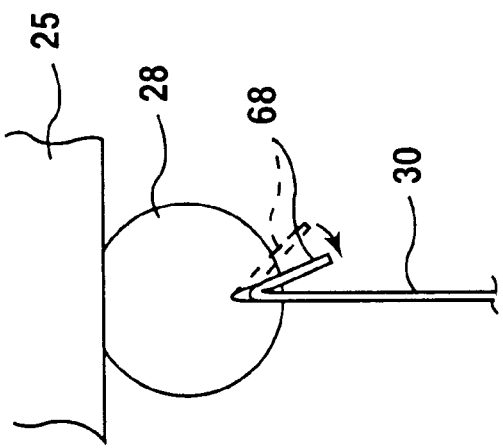
FIGS. 23A–23C show configurations of an upper end of a contact pin.

In the construction shown in FIG. 23A, an arcuate part 66 is provided at the end of the contact pins 30 by bending it into an arcuate configuration. The arcuate part 66 provides a spring action.

When the solder bump 28 presses the arcuate part 66 while the IC is being tested, the arcuate part 66 is deformed as illustrated in FIG. 23A. Therefore, the force (exercised as a counter force of a pressure provided by the lid 22 on the IC 25) against the solder bumps 28 can be relieved. Accordingly, the solder bumps 28 can be prevented from being damaged or deformed. Any variation in the height of the solder bumps 28 and the irregularity on the surface of the test board 23 cart be canceled.

Figure 23B:
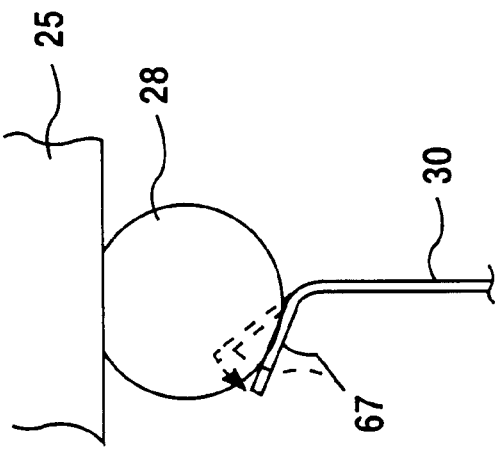

In the construction shown in FIG. 23B, the end of the contact pin 30 is bent to form a crooked part 67. The crooked part 67 formed at the end of the contact pins 30 provides the same function as the arcuate part 66 shown in FIG. 23A. Accordingly, the solder bumps 28 can be prevented from being damaged or deformed. Any variation in the height of the solder bumps 28 and the irregularity on the surface of the test board 23 can be canceled by the crooked part 67.

As has been described, by forming the spiral part 63, the randomly deformed part 64, the coil part 65, the arcuate part 66 or the crooked part 67 at that portion of the contact pins 30 connected with the solder bump 28 so that any of these parts comes into contact with the solder bump 28 and is deformed accordingly, any variation in the height of the solder bumps 28 and the irregularity on the surface of the test board 23 can be canceled. Since the parts 63–67 are deformed according to the configuration of the solder bump 28, a relatively wide contact area is secured. Accordingly, an electrical conductivity between the contact pins 30 and the solder bumps 28 can be improved.

Also, even if the material forming the solder bumps 28 is soft, the contact pins 30 and the solder bumps 28 can be electrically connected to each other without any damage being caused in the solder bumps 28 because the parts 63–67 are formed to be deformable.

Figure 23C:
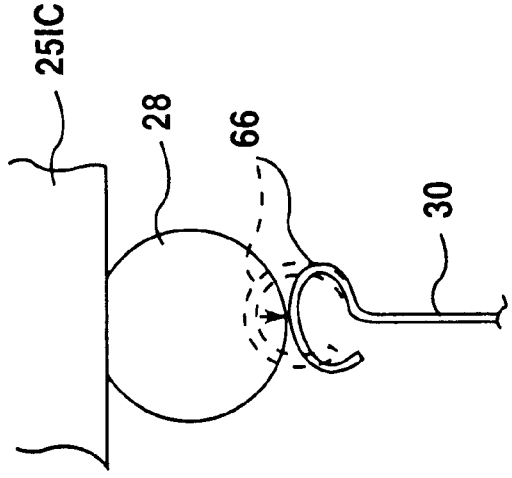

In the construction shown in FIG. 23C, the contact pin 30 is provided with a sharply-bent part 68 provided by bending the end of the contact pin 30 piercing the solder bump 28 in a sharp angle.

The sharply bent part 68 formed at the end of the contact pin 30 is bent in an even sharper angle when the contact pin 30 pierce the solder bump 28 (that is, the sharply bent part 68 is deformed from the state indicated by the broken line of FIG. 23C to the state indicated by the solid line). The sharply bent part 68 that has pierced the solder bump 28 and is located therein presses the solder bump toward the periphery of the solder bump 28, due to an elastic resilient force. Accordingly, an electrical connection between the contact pins 30 and the solder bumps 28 can be properly established.

A description will now be given of the mounting mechanism for mounting the IC sockets 20, 20A–20D on the test board 32.

FIGS. 24A–24C shows variations of the mounting mechanism. The mounting mechanisms shown in FIGS. 24A–24C have the same basic construction. In the construction shown in FIG. 24A, an elastically deformable part 71 is formed at that end of the contact pin 30 which is connected to the test board 23. In the construction shown in FIG. 24B, an elastically deformable part 72 is formed at that end of the contact pin 30 which is connected to the test board 23. In the construction shown in FIG. 24C, an elastically deformable part 73 is formed at that end of the contact pin 30 which is connected to the test board 23. The contact pin 30 is pressed against a through hole 70 formed in the test board 32 due to an elastic resilient force generated when the elastically deformable part 71 (72, 73) is inserted, so that an electrical connection is properly established between the elastically deformable part 71 (72, 73) and the through hole 70.

More specifically, the elastically deformable part 71 shown in FIG. 24A is in the form of a sharp edged bend 71; the elastically deformable part 72 shown in FIG. 24B is in the form of a curve; and the elastically deformable part 73 shown in FIG. 24C is in the form of a coil.

The elastically deformable part 71 (72, 73) is fitted in the through hole 70 by first deforming them so that it is elongated in the longitudinal direction and inserting it in the through hole 70 while the elongated state is maintained. Subsequently, the elastically deformable part is relieved of the force applied to cause the elongated deformation. Thus, the elastically deformable part 71 (72, 73) returns to an original configuration due to an elastic resiliency inside the through hole 70. Due to this elastic resilient force, the elastically deformable part 71 (72, 73) presses itself against the inner wall of the through hole 70 and establishes an electrical connection therewith.

According to the above-described mounting mechanism for mounting the IC socket 20, 20A–20D on the test board 32, an electrical connection between the contact pins 30 and the test board 32 can be properly established by a simple operation of inserting the elastically deformable parts 71 (72, 73) into the through hole 70. Since the elastically deformable part 71 (72, 73) presses the through hole 70 by an elastic resilient force while the electrical connection is established, an electrical conductivity between the contact pins 30 and the test board 32 can be improved.

Figure 25A:
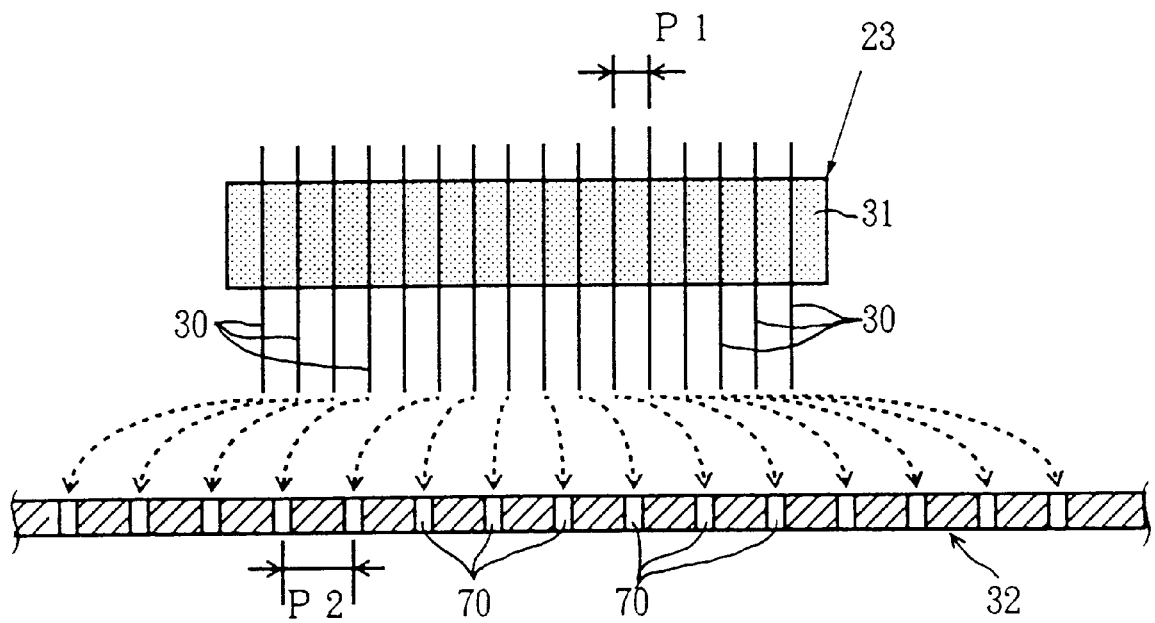
FIGS. 25A and 25B shows how a contact pin is connected to a test board.
Figure 25B:
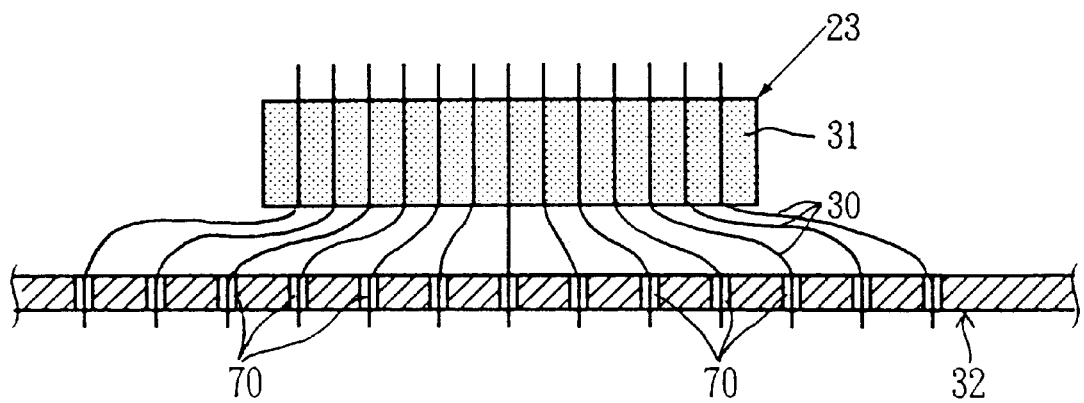

In the mounting mechanism shown in FIGS. 25A and 25B, the through holes 70 are formed at a pitch P2 wider than the pitch P1 at which the solder bumps 28 and the contact pins 30 are provided (P1<P2). As shown in FIG. 25A, the foot of the contact pins 30 projecting toward the test board 32 through the elastic member 31 supporting the contact pins 30 are configured to be long enough to reach the respective through holes 70.

As shown in FIG. 25B, the contact pins 30 are electrically connected to the test board 32 such that the portions of the contact pins 30 projecting through the elastic member 31 are guided into the respective through holes 70 and connected thereto.

According to the mounting mechanism of FIGS. 25A and 25B, the pitch P2 of the through holes 70 is wider than the pitch P1 of the solder bumps which may be relatively narrow. Therefore, forming of the through holes 70 becomes easier, and forming of the wiring pattern (not shown) provided on the test board 32 for connection with the through holes 70 also becomes easier.

The present invention is not limited to the above-described embodiments, and variations and modifications may be made without departing from the scope of the present invention.

What is claimed is:

1. An IC socket mounted on a test board while in use and having a semiconductor device with projection electrodes mounted on said IC socket for testing, comprising:

a supporting structure made of an elastic member; and a plurality of straight contact pins which are supported by the supporting structure so as to be embedded therein, each pin having a first end electrically connected to said test board and a second end thereof connected to one of said projection electrodes, each of the straight contact pins having a diameter sufficiently small for each of said plurality of contact pins to pierce a corresponding one of said projection electrodes, said IC socket being electrically connected to said test board by said second end of said plurality of contact pins piercing said projection electrodes, wherein each of said straight contact pins consists of a wire member having a substantially constant diameter along its length.

2. The IC socket as claimed in claim 1, wherein the diameter of each of said plurality of contact pins is 1/5–1/10 of a diameter of said projection electrodes.

3. The IC socket as claimed in claim 1, wherein said plurality of contact pins are arranged such that each of said plurality of contact pins is aligned with a corresponding one of said projection electrodes.

4. The IC socket as claimed in claim 1, wherein said plurality of contact pins are arranged such that a plurality of contact pins are aligned with a corresponding one of said projection electrodes.

5. The IC socket as claimed in claim 1, wherein a supporting structure for supporting said plurality of contact pins is provided, said plurality of contact pins projecting from said supporting structure by a distance commensurate with a depth of each of said plurality of contact pins piercing the corresponding one of said projection electrodes.

6. The IC socket as claimed in claim 5, wherein said supporting structure and a main body of said IC socket are separate from each other.

7. The IC socket as claimed in claim 5, wherein said supporting structure is provided with an insulating member in which a semiconductor device positioning part for positioning said semiconductor device is provided.

8. The IC socket as claimed in claim 5, wherein said supporting structure is provided with an insulating member in which a projection electrode positioning part for positioning said projection electrodes is provided.

9. The IC socket as claimed in claim 5, wherein said supporting structure is provided with an integral semiconductor device positioning part for positioning said semiconductor device.

10. The IC socket as claimed in claim 5, wherein said supporting structure is provided with an integral projection electrode positioning part for positioning said projection electrodes.

11. The IC socket as claimed in claim 5, wherein said supporting structure comprises:

an elastic member in which said plurality of contact pins are embedded; and a guide plate provided on at least one of a upper major surface and a lower major surface of said elastic member and provided with positioning holes in which said plurality of contact pins are inserted and positioned.

12. The IC socket as claimed in claim 11, wherein said guide plate is provided on at least the upper major surface of said elastic member and said plurality of contact pins are secured to said guide plate so that said plurality of contact pins are in a uniform height.

13. The IC socket as claimed in claim 11, wherein said guide plate is provided with connection parts electrically connected with said plurality of contact pins, land parts provided at a pitch wider than a pitch of said plurality of connection parts, and lead parts connecting said connection parts and said land parts.

14. The IC socket as claimed in claim 5, wherein said supporting structure is implemented by a pair of support plates provided with supporting holes in which said plurality of contact pins are inserted and supported therein, said pair of support plates being spaced apart from each other so as to be near respective ends of said plurality of contact pins.

15. The IC socket as claimed in claim 1, wherein said elastic member is reduced at least at those portions in the vicinity of one of the first and second ends of said plurality of contact pins so that one of the first and second ends of said plurality of contact pins are exposed on a surface of said elastic member.

16. The IC socket as claimed in claim 1, said IC socket is provided with a positioning plate provided with a device positioning part for positioning said semiconductor device at an appropriate position, said positioning plate being provided with through holes for guiding said plurality of contact pins at positions aligned with said project ion electrodes.

17. The IC socket as claimed in claim 16, wherein guide recesses for guiding said projection electrodes are provided in said through holes.

18. The IC socket as claimed in claim 16, wherein guide recesses for guiding said plurality of contact pins are provided in said through holes.

19. The IC socket as claimed in claim 16, wherein a plating formed of a conductive material is formed in said through holes at those positions which are in contact with said plurality of contact pins and said projection electrodes.

20. The IC socket as claimed in claim 1, wherein at least the second end of each of said plurality of contact pins is formed as a sharp edge.

21. The IC socket as claimed in claim 1, wherein at least the second end of each of said plurality of contact pins is formed as a sharp bend.

22. An IC test system for testing a semiconductor device mounted on an IC socket which is mounted on a test board connected to a test device, a supporting structure made of an elastic member; and a plurality of straight contact pins which are supported by the supporting structure so as to be embedded therein, each pin having a first end electrically connected to said test board and a second end thereof connected to one of said projection electrodes, each of the straight contact pins having a diameter sufficiently small for each of said plurality of contact pins to pierce a corresponding one of said projection electrodes, said IC socket being electrically connected to said test board by said second end of said plurality of contact pins piercing said projection electrodes, wherein each of said straight contact pins consists of a wire member having a substantially constant diameter along its length.

* * * * *

UNITED STATES PATENT AND TRADEMARK OFFICE
CERTIFICATE OF CORRECTION

PATENT NO. : 6,229,320 B1
DATED : May 8, 2001
INVENTOR(S) : Makoto Haseyama

Page 1 of 1

It is certified that error appears in the above-identified patent and that said Letters Patent is hereby corrected as shown below:

<u>Title page,</u>
Item [63], change "September 23, 1996," to read -- September 23, 1995, --.
Item [30], insert "Nov. 18, 1994 (JP) ................................ 6-285342".

Signed and Sealed this

Twenty-ninth Day of January, 2002

Attest:

Attesting Officer

JAMES E. ROGAN
Director of the United States Patent and Trademark Office